United States Patent
Shinohara et al.

(10) Patent No.: US 10,649,000 B2
(45) Date of Patent: May 12, 2020

(54) CONNECTION ASSEMBLY

(71) Applicant: Panasonic Intellectual Property Management Co., Ltd., Osaka (JP)

(72) Inventors: Takahiro Shinohara, Hyogo (JP); Hitoshi Yoshida, Osaka (JP); Kazuo Goda, Osaka (JP); Rie Okamoto, Osaka (JP); Hiroshi Nakatsuka, Osaka (JP); Masako Yamaguchi, Osaka (JP); Hideki Ueda, Fukui (JP); Takanori Aoyagi, Osaka (JP); Yuki Maegawa, Osaka (JP); Takuya Kajiwara, Osaka (JP); Keisuke Kuroda, Fukui (JP); Takeshi Mori, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 149 days.

(21) Appl. No.: 15/760,615

(22) PCT Filed: Nov. 2, 2016

(86) PCT No.: PCT/JP2016/004792
§ 371 (c)(1),
(2) Date: Mar. 15, 2018

(87) PCT Pub. No.: WO2017/104103
PCT Pub. Date: Jun. 22, 2017

(65) Prior Publication Data
US 2018/0267079 A1    Sep. 20, 2018

(30) Foreign Application Priority Data

Dec. 17, 2015 (JP) ................. 2015-245850
Dec. 21, 2015 (JP) ................. 2015-248157
(Continued)

(51) Int. Cl.
*G01P 15/08* (2006.01)
*G01P 15/125* (2006.01)
(Continued)

(52) U.S. Cl.
CPC ........ *G01P 15/125* (2013.01); *G01P 15/0802* (2013.01); *G01P 15/18* (2013.01); *H01L 29/84* (2013.01); *G01P 2015/0862* (2013.01)

(58) Field of Classification Search
CPC .... G01P 15/125; G01P 15/18; G01P 15/0802; G01P 2015/0862; H01L 29/84
See application file for complete search history.

(56) References Cited

U.S. PATENT DOCUMENTS 3,737,729 A * 6/1973 Carney ................ H05K 3/3405
361/740
4,879,589 A * 11/1989 Saint-Cyr ............... H01L 21/50
257/703
(Continued)

FOREIGN PATENT DOCUMENTS

JP 7-113708 5/1995
JP 11-023610 1/1999
(Continued)

OTHER PUBLICATIONS

International Search Report of PCT application No. PCT/JP2016/004792 dated Jan. 31, 2017.

*Primary Examiner* — David J Bolduc
(74) *Attorney, Agent, or Firm* — McDermott Will & Emery LLP

(57) ABSTRACT

A connection assembly includes a sensor substrate, a layer substrate coupled to the sensor substrate so as to face an upper surface of the sensor substrate, and a wire connected between the sensor substrate and the layer substrate. The sensor substrate includes first and second projections provide on the upper surface of the sensor substrate and
(Continued)

extending in an extension direction along the upper surface of the sensor substrate. The wire has a first end sandwiched between the layer substrate and the first projection, and a second end sandwiched between the layer substrate and the second projection. The connection assembly provides reliable connection.

6 Claims, 24 Drawing Sheets

(30) Foreign Application Priority Data

| Dec. 21, 2015 | (JP) | ................................. | 2015-248158 |
| Dec. 22, 2015 | (JP) | ................................. | 2015-250136 |
| Mar. 23, 2016 | (JP) | ................................. | 2016-057958 |

(51) Int. Cl.
*G01P 15/18* (2013.01)
*H01L 29/84* (2006.01)

(56) References Cited

U.S. PATENT DOCUMENTS

| 5,426,563 | A | * | 6/1995 | Moresco | H01L 21/486 |
| | | | | | 257/E23.065 |
| 5,568,361 | A | * | 10/1996 | Ward | H05K 1/14 |
| | | | | | 361/735 |
| 5,616,521 | A | * | 4/1997 | Cook, Sr. | G01L 19/0038 |
| | | | | | 29/840 |
| 5,691,885 | A | * | 11/1997 | Ward | H05K 1/14 |
| | | | | | 361/735 |
| 5,854,534 | A | * | 12/1998 | Beilin | H01L 23/49838 |
| | | | | | 257/691 |
| 5,864,062 | A | * | 1/1999 | Nagahara | B81C 1/0023 |
| | | | | | 257/417 |
| 6,040,625 | A | * | 3/2000 | Ip | B81B 7/007 |
| | | | | | 257/719 |
| 6,369,445 | B1 | * | 4/2002 | Khoury | G01R 1/06716 |
| | | | | | 257/723 |
| 6,404,046 | B1 | * | 6/2002 | Glenn | H01L 23/3107 |
| | | | | | 257/678 |
| 6,440,775 | B2 | * | 8/2002 | Khoury | H01L 23/13 |
| | | | | | 257/E23.004 |
| 6,492,699 | B1 | * | 12/2002 | Glenn | H01L 27/14618 |
| | | | | | 257/433 |
| 6,518,659 | B1 | * | 2/2003 | Glenn | H01L 23/043 |
| | | | | | 257/686 |
| 7,419,382 | B2 | * | 9/2008 | Suzuki | H01L 24/11 |
| | | | | | 257/E21.508 |
| 7,936,176 | B2 | * | 5/2011 | Nielsen | G01R 1/07392 |
| | | | | | 257/48 |
| 8,193,555 | B2 | * | 6/2012 | Lin | H01L 27/14618 |
| | | | | | 257/294 |
| 8,742,545 | B2 | * | 6/2014 | Zhu | H01L 31/0392 |
| | | | | | 257/616 |
| 8,810,023 | B2 | * | 8/2014 | Koduri | G01P 15/0802 |
| | | | | | 257/692 |
| 10,015,882 | B1 | * | 7/2018 | Murdock | H05K 5/0239 |
| 10,240,953 | B2 | * | 3/2019 | Hansen | B81B 7/0058 |
| 2006/0163679 | A1 | * | 7/2006 | LaFond | G01C 19/5719 |
| | | | | | 257/414 |
| 2006/0169042 | A1 | * | 8/2006 | Hulsing, II | G01P 15/125 |
| | | | | | 73/510 |
| 2007/0022814 | A1 | * | 2/2007 | Seto | G01P 1/023 |
| | | | | | 73/514.34 |
| 2007/0132047 | A1 | * | 6/2007 | Kuisma | B81C 1/0023 |
| | | | | | 257/415 |
| 2008/0073739 | A1 | * | 3/2008 | Kitamura | H01L 23/055 |
| | | | | | 257/433 |
| 2008/0128848 | A1 | * | 6/2008 | Suzuki | H01L 23/481 |
| | | | | | 257/448 |
| 2009/0261432 | A1 | * | 10/2009 | Wilner | B81B 7/0006 |
| | | | | | 257/418 |
| 2010/0072862 | A1 | * | 3/2010 | Berger | B81B 7/0058 |
| | | | | | 310/370 |
| 2011/0265564 | A1 | * | 11/2011 | Acar | G01C 19/5712 |
| | | | | | 73/504.08 |
| 2012/0012949 | A1 | * | 1/2012 | Winkler | G01L 9/0054 |
| | | | | | 257/415 |
| 2013/0193532 | A1 | * | 8/2013 | Horie | H01L 29/84 |
| | | | | | 257/415 |
| 2013/0307094 | A1 | * | 11/2013 | Yoshiuchi | G01C 19/5783 |
| | | | | | 257/415 |
| 2013/0313663 | A1 | * | 11/2013 | Kato | B06B 1/0292 |
| | | | | | 257/416 |
| 2014/0027868 | A1 | * | 1/2014 | Ashida | G01B 7/16 |
| | | | | | 257/418 |
| 2015/0260752 | A1 | | 9/2015 | Kishimoto et al. | |
| 2016/0013112 | A1 | * | 1/2016 | Ihle | G01D 11/245 |
| | | | | | 257/414 |
| 2017/0336436 | A1 | * | 11/2017 | Maegawa | H01L 23/04 |
| 2017/0345949 | A1 | * | 11/2017 | Tomita | G01L 9/00 |

FOREIGN PATENT DOCUMENTS

| JP | 2000-164741 | 6/2000 |
| JP | 4692373 B | 6/2011 |
| JP | 2013-079895 | 5/2013 |
| JP | 2014-238280 | 12/2014 |
| JP | 2015-010856 | 1/2015 |
| JP | 5700655 B | 4/2015 |

\* cited by examiner

CONNECTION ASSEMBLY

CROSS-REFERENCE TO RELATED APPLICATIONS

This application is a U.S. national stage application of the PCT international application No. PCT/JP2016/004792 filed on Nov. 2, 2016, which claims the benefit of foreign priority of Japanese patent applications No. 2015-245850 filed on Dec. 17, 2015, No. 2015-248157 filed on Dec. 21, 2015, No. 2015-248158 filed on Dec. 21, 2015, No. 2015-250136 filed on Dec. 22, 2015, and No. 2016-057958 filed on Mar. 23, 2016, the contents all of which are incorporated herein by reference.

TECHNICAL FIELD

The present invention relates to a connection assembly applicable to various sensors, such as an acceleration sensor.

BACKGROUND ART

PTLs 1 to 3, for example, disclose connection assemblies each providing an electrical connection between a wiring and a semiconductor substrate with the wiring between the semiconductor substrate and a glass substrate.

PTLs 2, 4, and 5, for example, disclose conventional sensors having structures including a silicon substrate and glass substrates which are stacked. In these sensors, anodic bonding for stacking the silicon substrate and the glass substrates may cause warpage in these substrates. This may reduce accuracy of these sensors.

Micro-electromechanical system (MEMS) sensors have been known (see PYLs 1 to 3, for example). These sensors can detect acceleration of a mass body such that the sensors detect a displacement of the mass body by sensing a change in capacitance between a fixed electrode and an electrode disposed on the mass body, and then, determine the acceleration based on the detected displacement of the mass body.

MEMS sensors which can detect acceleration with sensors having comb shapes are disclosed in, for example, PTLs 1 to 3.

MEMS sensors are disclosed in 'TLs 7 and 8, each of which is provided with a correction circuit to correct its sensitivity in a direction in a main axis by using an output in a direction of another axis.

CITATION LIST

Patent Literature

PTL 1: Japanese Patent No. 4692373
PTL 2: Japanese Patent Laid-Open Publication No. 2013-79895
PTL 3: Japanese Patent Laid-Open Publication No. 2014-238280
PTL 4: Japanese Patent Laid-Open Publication No. 2000-164741
PTL 5: Japanese Patent Laid-Open Publication No. 7-113708
PTL 6: Japanese Patent No. 5700655
PTL 7: Japanese Patent Laid-Open Publication No. 2015-10856
PTL 8: Japanese Patent Laid-Open Publication No. 11-23610

SUMMARY

A connection assembly includes a sensor substrate, a layer substrate coupled to the sensor substrate so as to face an upper surface of the sensor substrate, and a wire connected between the sensor substrate and the layer substrate. The sensor substrate includes first and second projections provide on the upper surface of the sensor substrate and extending in an extension direction along the upper surface of the sensor substrate. The wire has a first end sandwiched between the layer substrate and the first projection, and a second end sandwiched between the layer substrate and the second projection.

The connection assembly provides reliable connection.

DETAIL DESCRIPTION OF PREFERRED EMBODIMENTS

Exemplary Embodiment 1

Figure 1:
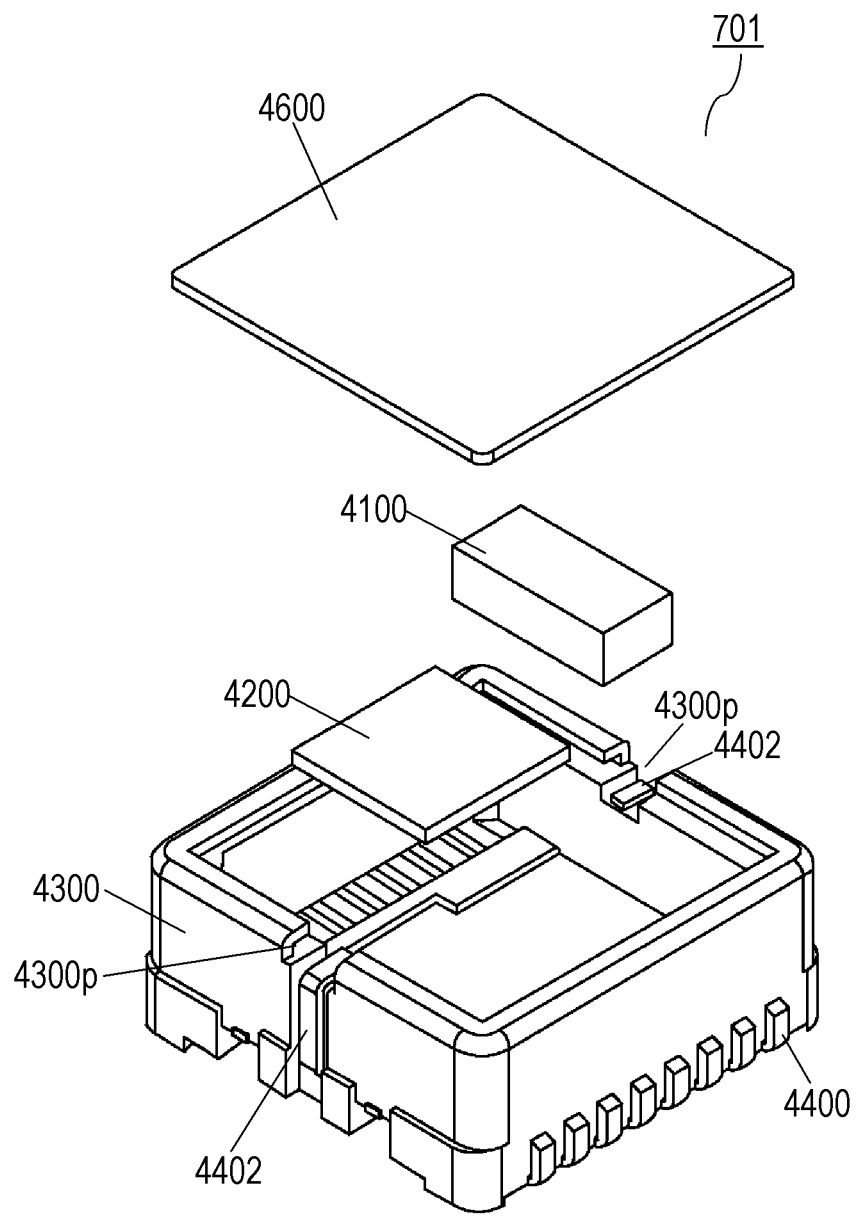
FIG. 1 is an exploded perspective view of a sensor according to Exemplary Embodiment 1.

FIG. 1 is an exploded perspective view of sensor 701 according to Exemplary Embodiment 1. Sensor 701 according to Embodiment 1 is an acceleration sensor for detecting an acceleration applied thereto. Sensor 701 includes sensor chip 4100, integrated circuit 4200 performing various calculations based on outputs from sensor chip 4100, package 4300 accommodating therein sensor chip 4100 and integrated circuit 4200, terminals 4400 led out from package 4300, leads 4402 led out from package 4300, and lid 4600 covering an upper surface of package 4300. In accordance with Embodiment 1, integrated circuit 4200 is an application-specific integrated circuit (ASIC).

Integrated circuit 4200 is connected electrically to sensor chip 4100 via metal wires so as to process electrical signals, such as signals indicating acceleration, output from sensor chip 4100. Then, the integrated circuit outputs the processed signal to the outside of package 4300.

Lid 4600 is made of metal material, such as stainless steel, and is disposed at a position covering an opening of package 4300. In other words, lid 4600 is disposed at the position to cover both sensor chip 4100 and integrated circuit 4200.

Package 4300 is made of resin material, such as liquid crystal polymer. Each of side surfaces of package 4300 facing leads 4402 inclines toward the inside of the package such that positions on the side surfaces located more inside as the positions approaches lid 4600. The term "inside" here means "a side in which integrated circuit 4200 and sensor chip 4100 are accommodated." This configuration provides a large space between package 4300 and each of leads 4402. Such a large space allows leads 4402 to be bent easily and does not prevent leads 4402 from functioning as spring.

Package 4300 accommodates both sensor chip 4100 and integrated circuit 4200 in the inside of the package. Both terminals 4400 and leads 4402 extend out from package 4300.

Terminals 4400 are electrically connected to a board outside sensor 701. Leads 4402 are electrically connected to lid 4600.

Figure 2:
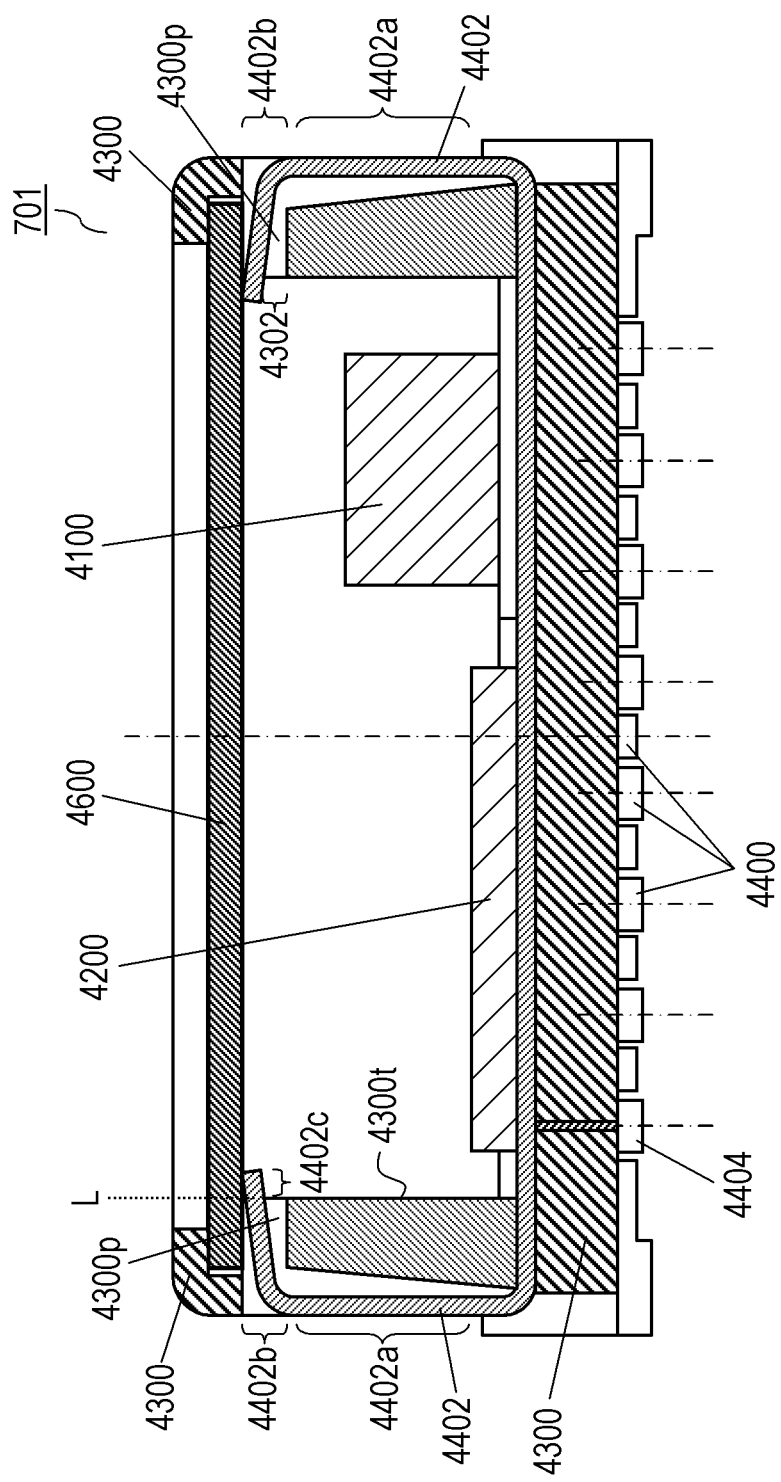
FIG. 2 is a cross-sectional view of the sensor according to Embodiment 1.

FIG. 2 is a cross-sectional view of sensor 701. Each of leads 4402 includes part 4402a and part 4402b connected to part 4402a. Part 4402a extends out from package 4300 and extends further along the side surface of package 4300. While FIG. 2 illustrates part 4402a extending in a vertical direction, the configuration is not limited to the case; the part, for example, may extend along the inward inclination of the side surface of package 4300.

Part 4402a is electrically connected to ground 4404. This configuration reduces a potential of lid 4600 connected with part 4402b to a ground potential.

Part 4402b extends toward the inside of package 4300, and is sandwiched between lid 4600 and package 4300 to be electrically connected to lid 4600.

In the above configuration, part 4402b which is a distal end of lead 4402 having been bent is pushed against lid 4600 by a spring force of lead 4402 per se. This configuration allows part 4402b to be electrically connected to lid 4600 stably.

Part 4402b is disposed in recess 4300p provided in an upper edge of package 4300. The depth of recess 4300p is preferably larger than the thickness of part 4402b. This configuration provides space 4302 between package 4300 and lid 4600 after lid 4600 is attached. In this configuration, for example, an X-ray inspection from a lateral direction can simply be performed to confirm whether or not leads 4402 appropriately contact lid 4600. However, the depth of recess 4300p may be not larger than the thickness of part 4402b. For example, the depth of recess 4300p may be substantially equal to the thickness of part 4402b. In this case, the upper edge of package 4300 can be approximately flush with part 4402b, hence reducing the size of package 4300.

End 4402c of part 4402b protrudes inward from inner wall surface 4300t of package 4300 which extends along line L. In this configuration, for example, an X-ray inspection from above can be simply performed to confirm whether or not leads 4402 are appropriately disposed.

Plural terminals 4400 configure to be connected to an external board extend from package 4300.

Figure 3:
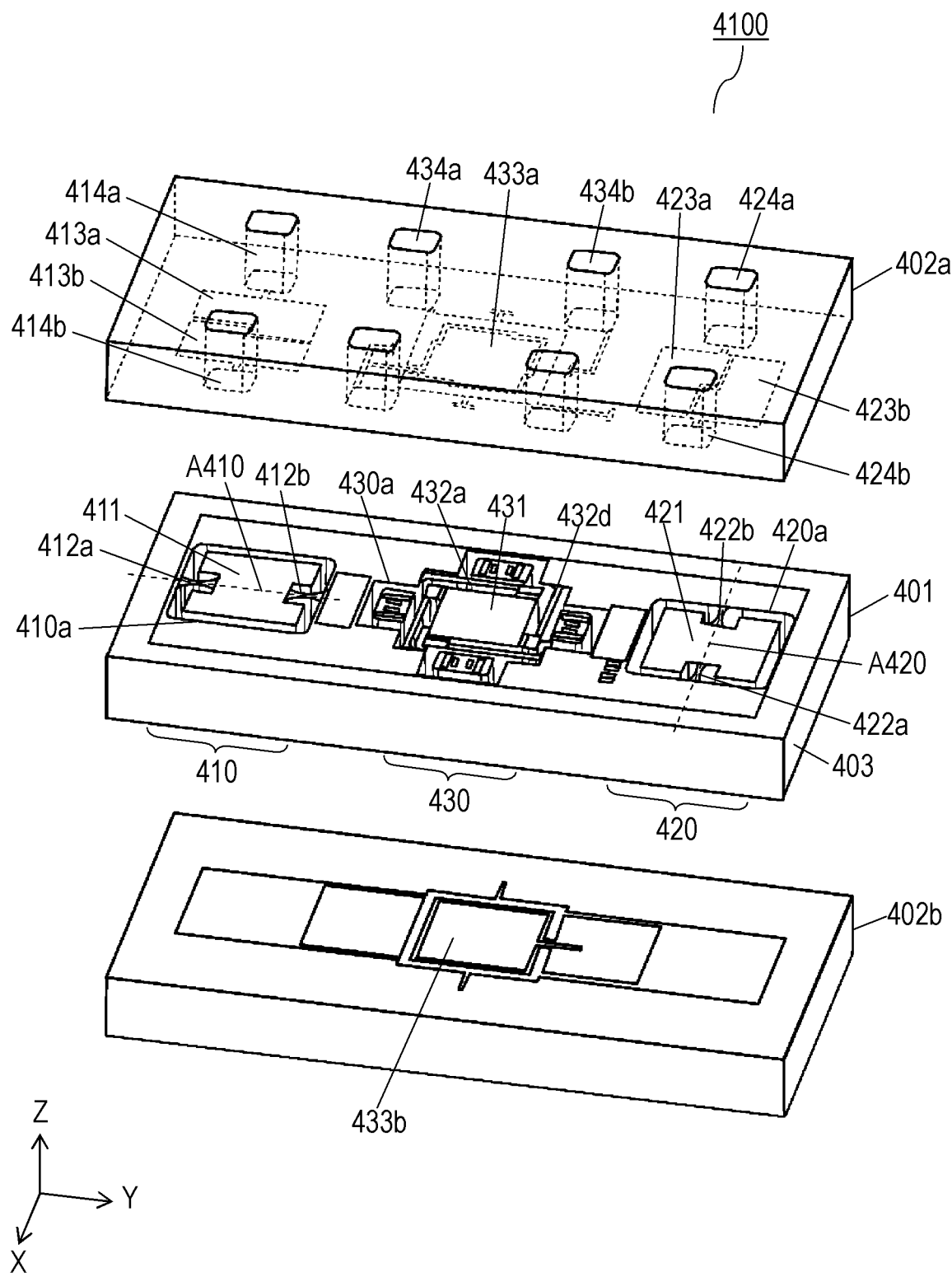
FIG. 3 is an exploded perspective view of a sensor chip of the sensor according to Embodiment 1.

FIG. 3 is an exploded perspective view of sensor chip 4100. Sensor chip 4100 is a connection assembly that includes: sensor substrate 401, layer substrate 402a joined to sensor substrate 401, and layer substrate 402b joined to sensor substrate 401. Layer substrate 402a is located above sensor substrate 401 while layer substrate 402b is located below sensor substrate 401. Sensor substrate 401 is sandwiched between layer substrates 402a and 402b. Sensor substrate 401 is made of, e.g. a silicon-on-insulator (SOI) substrate. Layer substrates 402a and 402b are made of insulator, such as glass. In other words, layer substrate 402a is a glass substrate, and layer substrate 402b is a glass substrate.

In FIG. 3, an X-axis, a Y-axis, and a Z-axis perpendicular to each other are defined. Sensor chip 4100 includes X-detection part 410 detecting acceleration in a direction of the X-axis, Y-detection part 420 detecting acceleration in a direction of the Y-axis, and Z-detection part 430 detecting acceleration in a direction of the Z-axis. The X-axis is contained in an XY-plane. The Y-axis is contained in the XY-plane and perpendicular to the X-axis. The Z-axis is perpendicular to the XY-plane.

X-detection part 410 includes rectangular frame 410a, beams 412a and 412b connected to rectangular frame 410a, movable electrode 411 supported by beams 412a and 412b, and fixed electrodes 413a and 413b. Beams 412a and 412b are arranged on axis A410 parallel to the Y-axis, and are disposed at position opposite to each other with respect to movable electrode 411. Movable electrode 411 is coupled to and supported by rectangular frame 410a via beams 412a and 412b. Movable electrode 411 can swing about axis A410, thereby detecting an acceleration in a direction of the X-axis. Axis A410 divides an upper surface of movable electrode 411 into two parts. One of the two parts of the upper surface of movable electrode 411 faces fixed electrode 413a in a direction of the Z-axis with a space between the part and fixed electrode 413a while the other part faces fixed electrode 413b in the direction of the Z-axis with a space between the part and fixed electrode 413b. Acceleration in a direction of the X-axis can be detected based on changes in a capacitance between movable electrode 411 and fixed electrode 413a and a capacitance between movable electrode 411 and fixed electrode 413b.

Y-detection part 420 includes rectangular frame 420a, beams 422a and 422b connected to rectangular frame 420a, movable electrode 421 supported by beams 422a and 422b, and fixed electrodes 423a and 423b. Beams 422a and 422b are arranged on axis A420 parallel to the X-axis, and are disposed opposite to each other with respect to movable electrode 421. Movable electrode 421 is coupled to and supported by rectangular frame 420a via beams 422a and 422b. Movable electrode 421 can swing about axis A420, thereby detecting acceleration in a direction of the Y-axis. Axis A420 divides an upper surface of movable electrode 421 into two parts. One part of the two parts the upper surface of movable electrode 421 faces fixed electrode 423a in the direction of the Z-axis with a space between the part and fixed electrode 423a. The other part of the two parts of the upper surface of movable electrode 421 faces fixed electrode 423b in the direction of the Z-axis with a space between the part and fixed electrode 423b. Acceleration in a direction of the Y-axis can be detected based on changes in a capacitance between movable electrode 421 and fixed electrode 423a and a capacitance between movable electrode 421 and fixed electrode 423b.

Z-detection part 430 includes rectangular frame 430a, beams 432a, 432b, 432c, and 432d connected to rectangular frame 430a, movable electrode 431 supported by beams 432a, 432b, 432c, and 432d, and fixed electrodes 433a and 433b. Movable electrode 431 is coupled to and supported by rectangular frame 430a via beams 432a, 432b, 432c, and 432d. Movable electrode 431 supported by beams 432a, 432b, 432c, and 432d can be translated in a direction of the Z-axis, thereby detecting acceleration in a direction of the Z-axis. An upper surface of movable electrode 431 faces fixed electrode 433a in the direction of the Z-axis with a space between movable electrode 431 and fixed electrode 433a. A lower surface of movable electrode 431 faces fixed electrode 433b in the direction of the Z-axis with a space between movable electrode 431 and fixed electrode 433b. Acceleration in the direction of the Z-axis can be detected based on changes in capacitance between movable electrode 431 and fixed electrode 433a and a capacitance between movable electrode 431 and fixed electrode 433b.

X-detection part 410 and Y-detection part 420 have the same shape, and are disposed with each turning on itself by 90 degrees relative to one another. Z-detection part 430 is disposed between X-detection part 410 and Y-detection part 420. X-detection part 410, Y-detection part 420, and Z-detection part 430 are disposed in a single chip. That is, as shown in FIG. 3, rectangular frames 410a, 420a, and 430a are arranged on a line extending in a direction of the Y-axis. Movable electrode 411 is disposed inside rectangular frame 410a. Movable electrode 421 is disposed inside rectangular frame 420a. Movable electrode 431 is disposed inside rectangular frame 430a. Movable electrode 411, movable electrode 421, and movable electrode 431 have substantially rectangular shapes viewing from above. A clearance of a predetermined width is provided between movable electrode 411 and a side wall of rectangular frame 410a. A clearance of a predetermined width is provided between movable electrode 421 and a side wall of rectangular frame 420a. A clearance of a predetermined width is provided between movable electrode 431 and a side wall of rectangular frame 430a. The shape of frames 410a, 420a, and 430a is not necessarily the rectangular shape, and may be other shapes, such as a circular shape. Sensor substrate 401 is joined to layer substrate 402a at connection part 403.

Fixed electrodes 413a and 413b are led out to an upper surface of layer substrate 402a through via-electrodes 414a and 414b, respectively. Via-electrodes 414a and 414b are made of conductive material, such as silicon, tungsten, or copper. Parts surrounding and holding via-electrodes 414a and 414b are made of insulating material, such as glass.

In X-detection part 410, each beams 412a and 412b couples respective one of substantial centers of the two opposite sides of a surface of movable electrode 411 to respective one of side walls of rectangular frame 410a, thereby swingably supporting movable electrode 411. Fixed electrodes 413a and 413b are disposed on a side of layer substrate 402a which faces movable electrode 411 fixed electrodes 413a and 413b while the boundary line between fixed electrodes 413a and 413b is axis A410 that connects between beam 412a and beam 412b. Fixed electrodes 413a and 413b are led out to the upper surface of layer substrate 402a through via-electrodes 414a and 414b. Via-electrodes 414a and 414b are made of conductive material, such as silicon, tungsten, or copper. A part surrounding and holding via-electrodes 414a and 414b is made of insulating material, such as glass.

In Y-detection part 420, similarly to X-detection part 410, each of beams 422a and 422b couples respective one of substantial centers of the two opposite sides of a surface of movable electrode 421 to respective one of side walls of rectangular frame 420a, thereby swingably supporting movable electrode 421. Fixed electrodes 423a and 423b are provided on a side of layer substrate 402a which faces movable electrode 421 while the boundary line between fixed electrodes 423a and 423b is axis A420 that connects between beam 422a and beam 422b. Fixed electrodes 423a and 423b are led out to the upper surface of layer substrate 402a through via-electrodes 424a and 424b. Via-electrodes 424a and 424b are made of conductive material, such as silicon, tungsten, or copper. A part surrounding and holding via-electrodes 424a and 424b is made of insulating material, such as glass.

In Z-detection part 430, four corners of movable electrode 431 are coupled to the side walls of rectangular frame 430a via two pair pf beams 432a, 432b, 432c, and 432d having L-shapes. This configuration allows movable electrode 431 to be translated in parallel with the Z-axis. The shape of beams 432a, 432b, 432c, and 432d is not necessarily the L-shape. The L-shape provides beams 432a, 432b, 432c, and 432d with a large length. Fixed electrode 433a facing movable electrode 431 is disposed on a lower surface of layer substrate 402a. Fixed electrode 433b facing movable electrode 431 is disposed on the upper surface of layer substrate 402b. Fixed electrode 433a is led out to the upper surface of layer substrate 402a through via-electrode 434a. Fixed electrode 433b is coupled to columnar electrode 435b that is separated away from movable electrode 431 while columnar electrode 435b is coupled to via-electrode 434b that is disposed in layer substrate 402a. This configuration allows fixed electrode 433b to be led out to the upper surface of layer substrate 402a through both columnar electrode 435b and via-electrode 434b. Via-electrodes 434a and 434b are made of conductive material, such as silicon, tungsten, or copper. Parts of layer substrate 402a and 402b surrounding and holding via-electrodes 434a and 434b are made of insulating material, such as glass.

Figure 4:
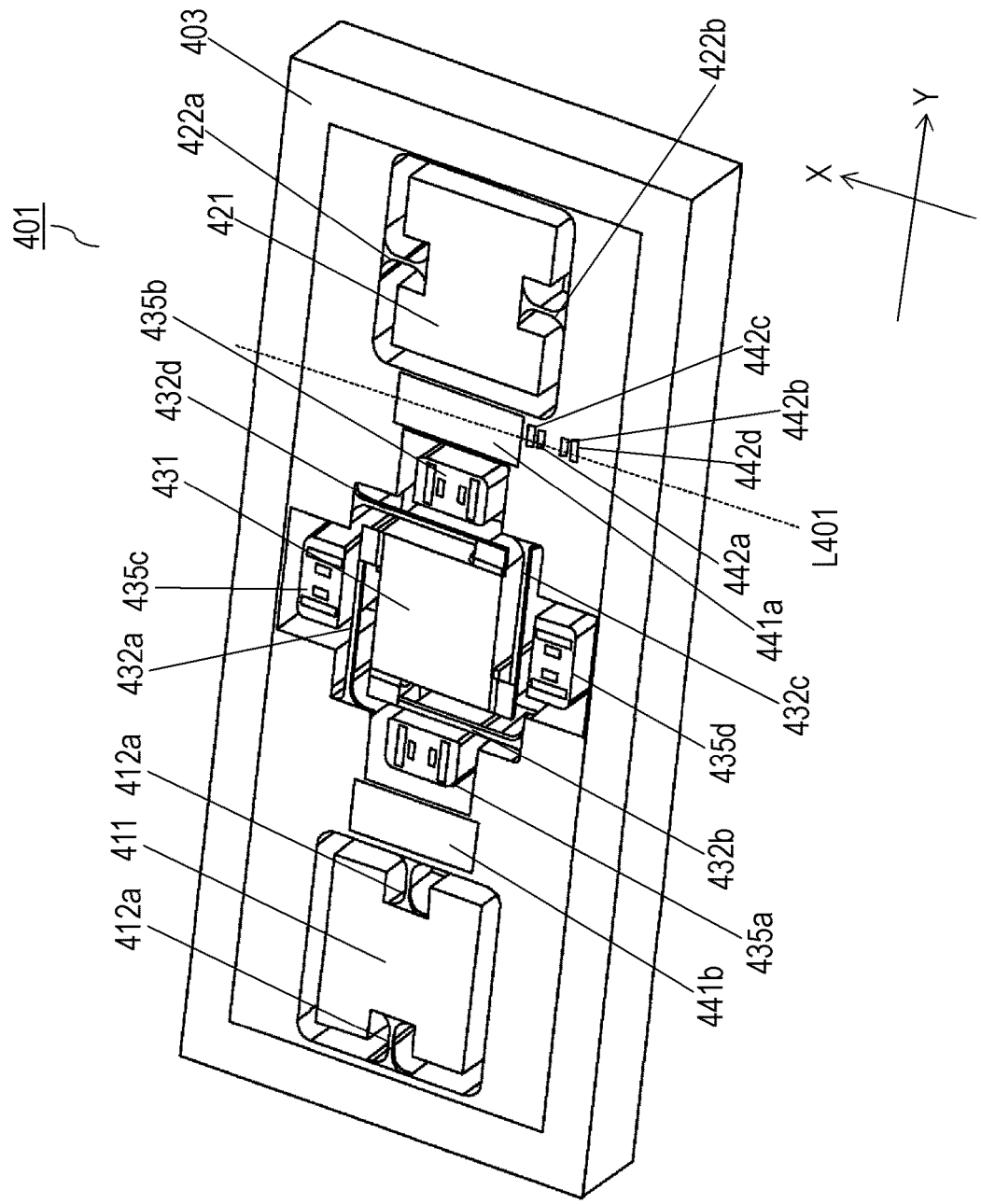
FIG. 4 is a top perspective view of a sensor substrate of the sensor chip according to Embodiment 1.
Figure 5:
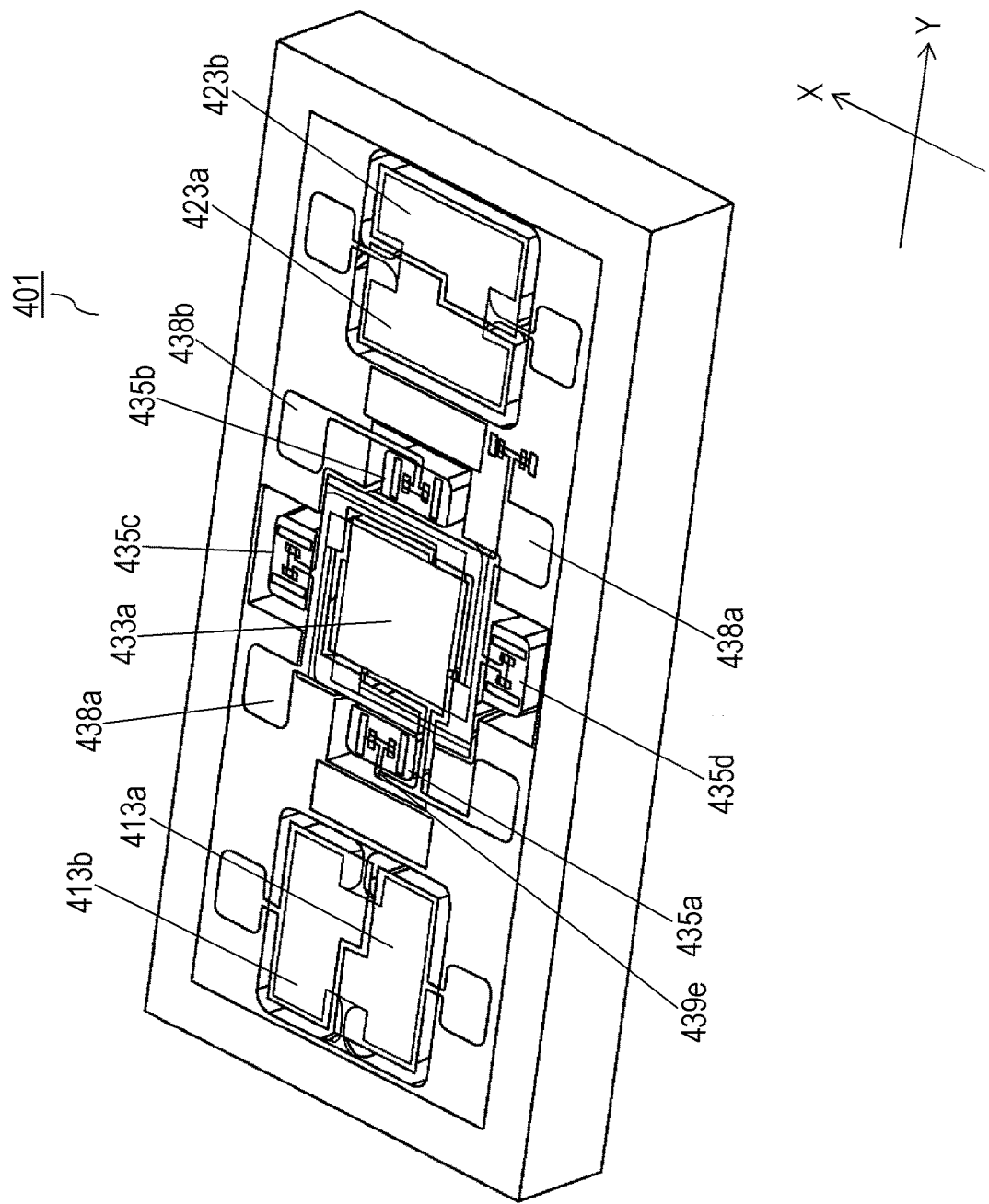
FIG. 5 is a top perspective view of the sensor substrate of the sensor chip according to Embodiment 1.

FIGS. 4 and 5 are top perspective views of sensor substrate 401. In FIG. 4, some of the electrodes are omitted for convenience of description.

Each of columnar electrodes 435a, 435b, 435c, and 435d is electrically insulated from all the movable electrodes and all the beams. In accordance with Embodiment 1, the columnar electrodes are formed by forming through-holes in a part of sensor substrate 401.

Columnar electrode 435a is electrically connected to fixed electrode 433a. Columnar electrode 435b is electrically connected to fixed electrode 433b.

Sensor substrate 401 is joined to layer substrate 402a at connection part 403.

Sensor substrate 401 includes connection parts 441a and 441b protruding toward layer substrate 402a. Connection parts 441a and 441b are joined to layer substrate 402a. Projections 442a and 442b are disposed close to connection part 441a. In other words, connection part 441a, projection 442a, and projection 442b are disposed at respective positions which lie on virtual straight line L401 in parallel with the upper surface of sensor substrate 401. Projection 442c and projection 442d are disposed close to projection 442a and projection 442b, respectively. The material, structure, size, positional relation of each of the projections will be described later. Sensor substrate 401 includes connection part 441d protruding toward layer substrate 402b. Connection part 441d is joined to layer substrate 402b similarly to connection part 441b.

Electrode 438a is disposed at a position overlapping beams 432a, 432b, 432c, and 432d viewing from above. Electrodes 438a is electrically connected to columnar electrode 435c, columnar electrode 435d, and via-electrode 434b.

Electrode 438b is electrically connected to columnar electrode 435b and via-electrode 434b. A function of electrode 438a will be described below. Sensor substrate 401 can be joined to layer substrates 402a and 402b by anodic bonding. The anodic bonding is a joining method in which sensor substrate 401 and layer substrate 402a are heated while an electric voltage applied between sensor substrate 401 and each of layer substrates 402a and 402b. In cases where electrodes 438a is absent, when performing the anodic bonding, the applied electric voltage between sensor substrate 401 and layer substrate 402a causes attraction between layer substrate 402a and each of the movable electrodes. This may cause the movable electrodes to contact layer substrate 402a, resulting in failure, such as sticking. On the other hand, in sensor 701 including electrodes 438a according to Embodiment 1, when performing the anodic bonding, the electric potential of electrodes 438a is substantially equal to the electric potential of sensor substrate 401. This configuration prevents the movable electrodes from contacting layer substrate 402a, thereby preventing failures, such as sticking.

Columnar electrodes 435a and 435b are disposed at positions facing each other across movable electrode 431 sandwiched between columnar electrodes 435a and 435b. Columnar electrodes 435c and 435d are disposed at positions face each other across movable electrode 431 sandwiched between columnar electrodes 435c and 435d.

Figure 6:
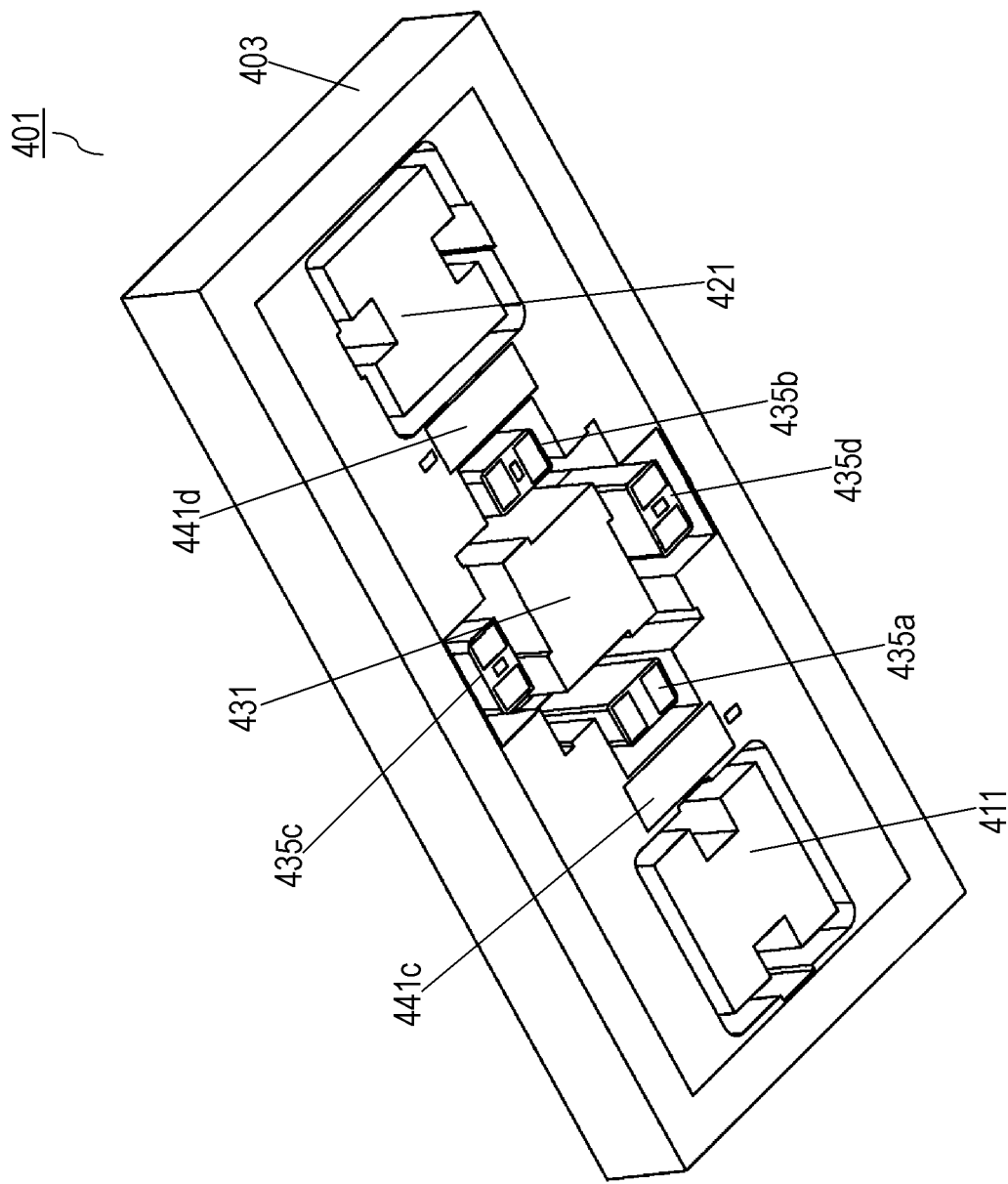
FIG. 6 is a bottom perspective view of the sensor substrate of the sensor chip according to Embodiment 1.
Figure 7:
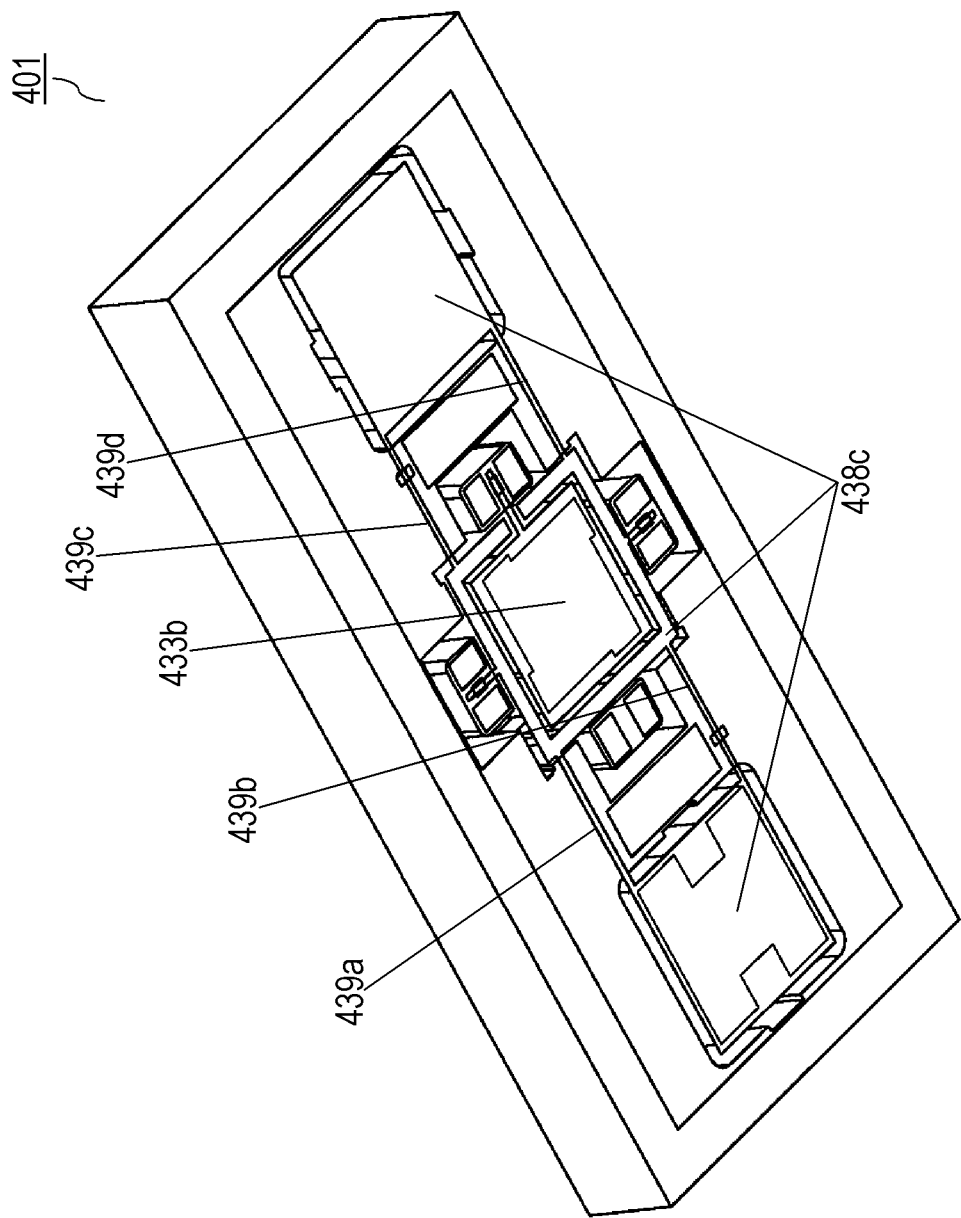
FIG. 7 is a bottom perspective view of the sensor substrate of the sensor chip according to Embodiment 1.

FIGS. 6 and 7 are bottom views of sensor substrate 401. In FIG. 6, some of the electrodes are omitted for convenience of description.

Electrode 438c is disposed at a periphery of fixed electrode 433b. Electrode 438c is electrically connected to columnar electrodes 435c and 435d.

Sensor substrate 401 includes connection parts 441c and 441d protruding toward layer substrate 402b. Connection parts 441c and 441d are joined to layer substrate 402b.

Figure 8A:
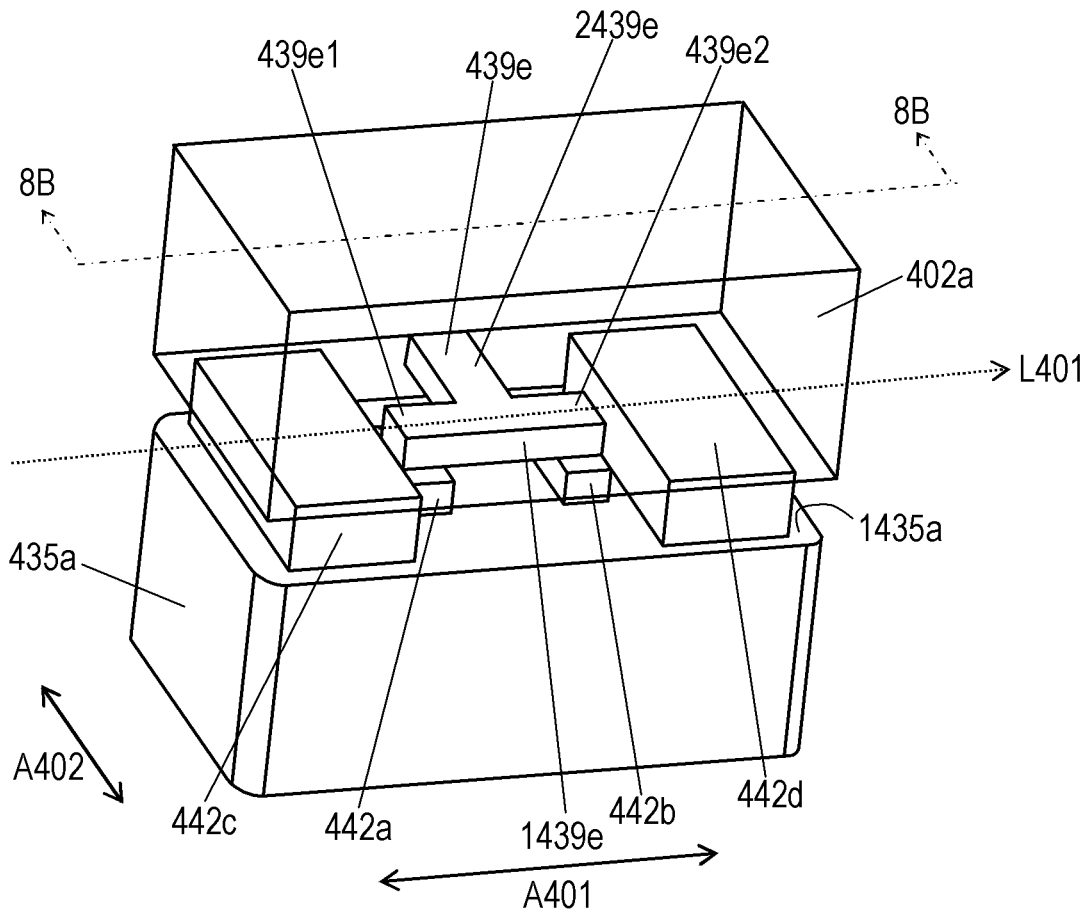
FIG. 8A is an enlarged view of the sensor shown in FIG. 5.
Figure 8B:
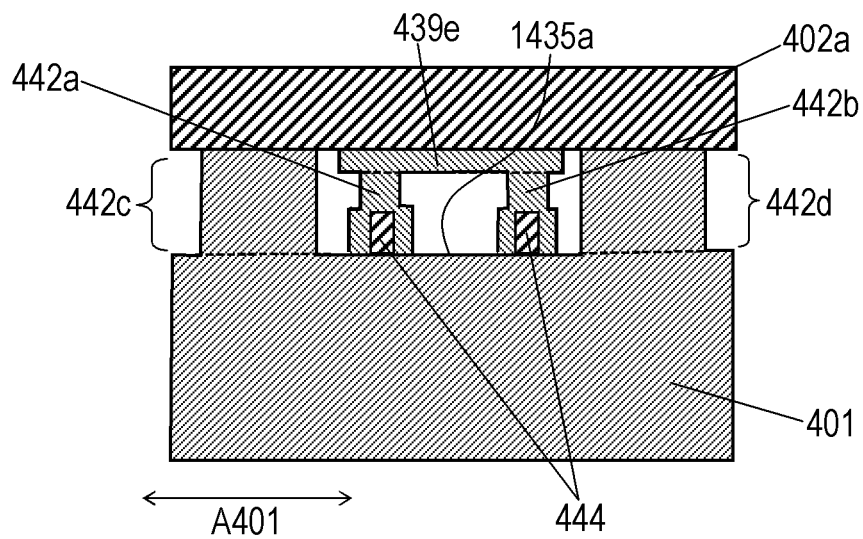
FIG. 8B is a cross-sectional view of the sensor on lines 8B-8B shown in FIG. 8A.

FIG. 8A is an enlarged view of sensor substrate 401 shown in FIG. 5. FIG. 8B is a cross-sectional view of sensor substrate 401 on line 8B-8B shown in FIG. 8A.

Projections 442a, 442b, 442c, and 442d are disposed on upper surface 1435a of columnar electrode 435a which is a part of the upper surface of sensor substrate 401. Projections 442c and 442d are preferably made of the same member as columnar electrode 435a, but may be made of different material. Projections 442a and 442b are made of metal that is disposed on the upper surfaces of oxide films 444 disposed on the upper surface of sensor substrate 401. The heights of projections 442a and 442b can be adjusted by adjusting the thickness of oxide films 444. Projections 442a to 442d extend slenderly along extension direction A402.

Wire 439a, wire 439b, wire 439c, and wire 439d electrically connect between electrodes 438c.

Electrode 439e includes a part forming a T-shape viewing from above. The part having the T-shape includes straight part 1439e extending from edge part 439e1 to edge part 439e2 and straight part 2439e extending perpendicularly from straight part 1439e from a substantial midpoint of straight part 1439e between edge part 439e1 and edge part 439e2. Edge part 439e1 is sandwiched between layer substrate 402a and projection 442a while edge part 439e2 is sandwiched between layer substrate 402a and projection 442b.

Wire 439e and all the projections are sandwiched between layer substrate 402a and sensor substrate 401, thereby electrically connecting wire 439e to the projections.

Projections 442c and 442d extend in extension direction A401 in parallel with projections 442a and 442b, and are arranged in direction A401 perpendicular to extension direction A402. Straight part 1439e of wire 439e extends slenderly in extension direction A401. Straight part 2439e extends slenderly in direction A402. The length of projection 442c in extension direction A402 is larger than the length of projection 442a in extension direction A402. The length of projection 442d in extension direction A402 is larger than the length of projection 442b in extension direction A402. The widths of projection 442c in direction A401 and projection 442d are larger than the widths of projections 442a and 442b in direction A401. The width of projection 442c in direction A401 is substantially equal to the width of projection 442d in direction A401. The width of projection 442a in direction A401 is substantially equal to the width of projection 442b in direction A401. Projections 442c and 442d are disposed close to a crashed portion, thus allowing wire 439e and projections 442a and 442b to be reliably crashed.

Sensor chip 4100 according to Embodiment 1 includes X-detection part 410, Y-detection part 420, and Z-detection part 430; however, its configuration is not limited to this. For example, sensor chip 4100 may include only X-detection part 410 out of X-detection part 410, Y-detection part 420, and Z-detection part 430. Alternatively, sensor chip 4100 may include only Z-detection part 430 out of X-detection part 410, Y-detection part 420, and Z-detection part 430.

Sensor substrate 401 according to Embodiment 1 includes four columnar electrodes 435a to 435d; however, its configuration is not limited to this. Sensor substrate 401 may include only columnar electrodes 435d out of X-detection part 410, Y-detection part 420, and Z-detection part 430.

Z-detection part 430 according to Embodiment 1 includes fixed electrodes 433a and 433b; however, its configuration is not limited to this. For example, Z-detection part 430 may include only fixed electrodes 433a out of fixed electrodes 433a and 433b. Movable electrode 431 is supported by plural beams 432a to 432d; however, its configuration is not limited to this. For example, movable electrode 431 may be supported by only a single beam.

In accordance with Embodiment 1, movable electrode 431 functions as a weight part as well as a movable part.

Sensor 701 according to Embodiment 1 is an acceleration sensor detecting acceleration; however, it is not limited to this. For example, sensor 701 may be another sensor, such as a pressure sensor detecting pressures or an angular velocity sensor detecting angular velocities.

Sensor 701 according to Embodiment 1 may be mounted, for example, to an electronic apparatus, such as a cellular phone so as to detect motion of the apparatus. Alternatively, sensor 701 may be mounted to a vehicle so as to detect motion of the vehicle. Sensor 701 according to Embodiment 1 can accurately detect motion of an electronic apparatus or, accurately control a vehicle.

Exemplary Embodiment 2

Figure 9:
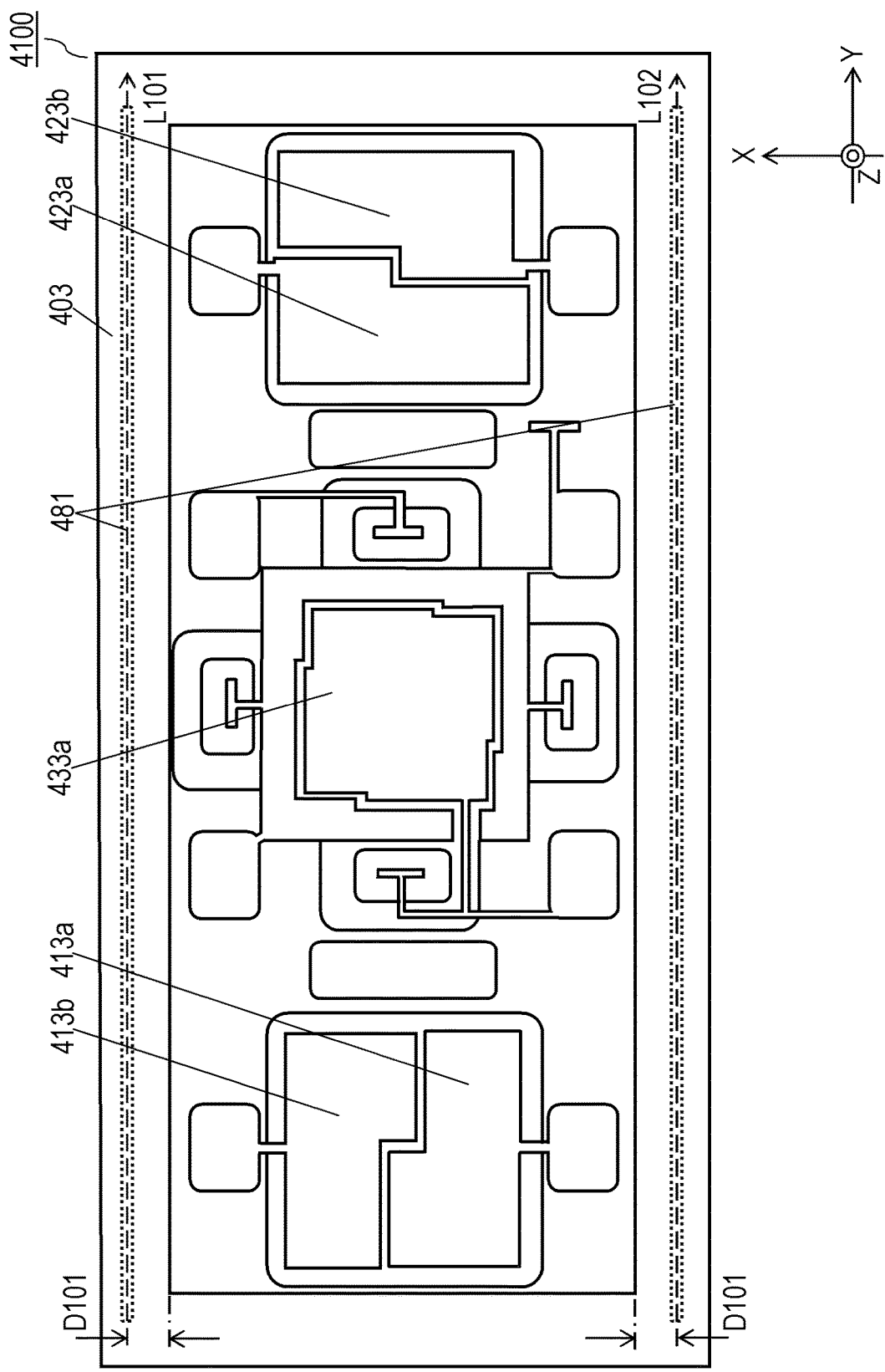
FIG. 9 is a top view of a sensor chip of a sensor according to Exemplary Embodiment 2.

A sensor according to Exemplary Embodiment 2 includes sensor chip 4100 that includes layer substrates 402a and 402b and sensor substrate 401 similarly to sensor 701 according to Embodiment 1 shown in FIGS. 1 to 7. FIG. 9 is a top view of sensor chip 4100 according to Embodiment 2.

Layer substrate 402a is a glass substrate allowing light to transmit through the substrate. Sensor substrate 401 and the electrodes, such as fixed electrodes 413a and 413b, which are disposed between sensor substrate 401 and layer substrate 402a viewing from above are visible through layer substrate 402a.

Sensor substrate 401 includes connection part 403 which is joined to layer substrate 402a. Connection part 403 includes parts 481 which are apart from layer substrate 402a and have line shapes. Parts 481 of sensor substrate 401 are not joined to layer substrate 402a. In more detail, sensor substrate 401 has grooves therein at parts 481, so that sensor substrate 401 does not contact layer substrate 402a at parts 481. Parts 481 can change distribution of a stress on sensor chip 4100 caused by the anodic bonding for the following reason. The anodic bonding is a method of joining a silicon substrate to a glass. In the method, a polished surface of the silicon substrate is placed on a polished surface of the glass, and then, a voltage is applied across between the silicon substrate and the glass while the silicon substrate and the glass are heated. When returning to a room temperature after the joining via heating, sensor chip 4100 has a stress therein due to a difference in a linear expansion coefficient between sensor substrate 401 made of an SOI substrate, i.e. a silicon substrate and each of layer substrates 402a and 402b made of glass. In this case, the stress on sensor chip 4100 is distributed to concentrate mainly on each of the beams. This is because that the beams receive the stress via connection part 403 by the anodic bonding. The connection part of sensor chip 4100 is apart from the layer substrate along the line shape, so that parts 481 apart from the layer substrate along the line shape can relieve the stresses caused by the anodic bonding. This changes the distribution of stress, that is, can relieve the stress on the beams.

Parts 481 apart from the layer substrate along the line shape are disposed along straight lines L101 and L102.

Parts 481 apart from the layer substrate along the line shape are provided in connection part 403 such that parts 481 are located away from the inner edge of sensor substrate 401 by distance D101. This configuration can change the distribution of the stress on sensor chip 4100 over the entire chip, thereby relieving the stress concentrating on the beams. In the case that distance D101 is equal to or larger than 50 μm, airtightness of the inside of sensor chip 4100 can be retained. Distance D101 is preferably equal to or larger than 100 μm.

Parts 481 apart from the layer substrate along the line shape are disposed such that the parts are longer than at least the inner edge of sensor substrate 401 of connection part 403 and are not longer than the outer edge of sensor substrate 401 of connection part 403. This configuration can change of the distribution of the stress on sensor chip 4100 over the entire chip.

The parts of sensor chip 4100 may be apart from the layer substrate an end surface of sensor chip 4100 along the line shape. This configuration changes the position of a portion receives a stress caused by the anodic bonding, resulting in great effects. The length of part 481 apart along the line shape may be equal to or larger than one third the total length of connection part 403. The part 481 preferably has a line or plane shape.

In accordance with the embodiment, connection part 403 on each of the long sides of sensor chip 4100 is apart from the layer substrate along the line shape, the configuration is not limited to this. For example, in the case where movable electrode 411 operates unstably due to the stress, only an area near movable electrode 411 may be apart from the layer substrate. In the case where both movable electrodes 411 and 421 operate unstably, only areas near movable electrodes 411 and 421 may be apart from the layer substrate.

Figure 10:
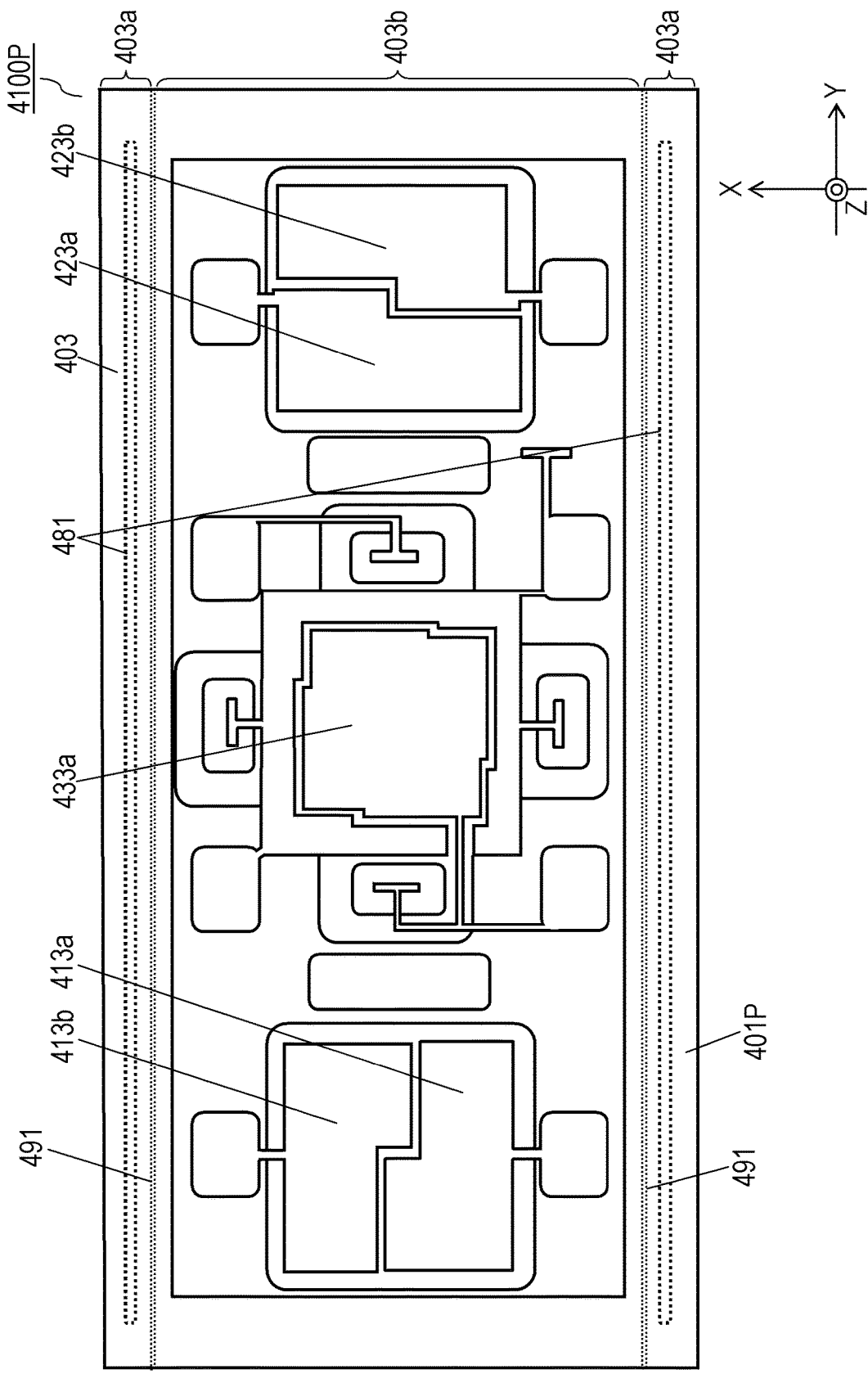
FIG. 10 is a top view of the sensor chip according to Embodiment 2.

FIG. 10 is a top view of sensor chip 4100P according to Embodiment 2. Sensor chip 4100P is the same as sensor chip 4100 shown in FIG. 9 except that sensor chip 4100P includes sensor substrate 401P instead of sensor substrate 401. In FIG. 10, components identical to those of sensor chip 4100 shown in FIGS. 1 to 9 are denoted by the same reference numerals. Sensor chip 4100P shown in FIG. 10 is different from sensor chip 4100P shown in FIG. 9 in grooves 491 provided in the upper surface of sensor substrate 401P. Grooves 491 divide connection part 403 into plural parts. Grooves 491 divide connection part 403 into connection parts 403a and connection part 403b. Each of connection part 403a is provided with part 481 apart from the layer substrate along the line shape, thereby functioning as parts for adjusting the stress. Connection part 403b which does not have part 481 apart from the layer substrate along the line shape is used only for jointing sensor substrate 401P to layer substrate 402a.

The structure in which connection parts 403a is separated away from connection part 403b can avoid a problem that, in detaching process, areas other than the desired part are unfavorably detached. That is, in the detaching process as well, grooves 491 functions as a buffer for securing the coupling of connection part 403b, thereby preventing any coupling part other than the desired part from being detached. This prevents deterioration in the airtightness and the like of sensor chip 4100.

In this case, In order to prevent areas other than the desired coupling part from being detached, each of grooves 491 has a depth equal to or larger than 1 μm and a width equal to or larger than 10 μm.

Figure 11:
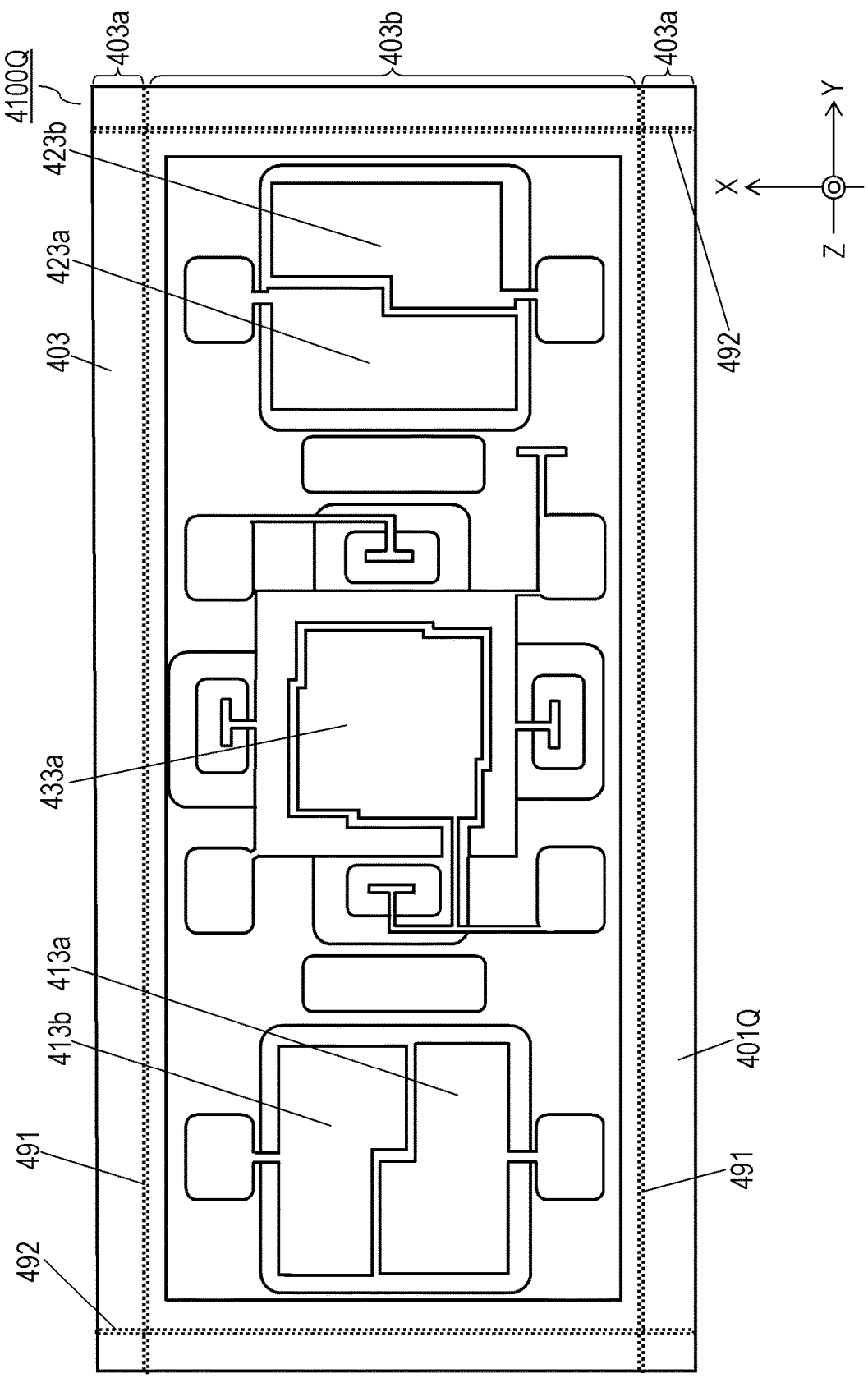
FIG. 11 is a top view of the sensor chip according to Embodiment 2.

FIG. 11 is a top view of sensor chip 4100Q according to Embodiment 2. Sensor chip 4100Q includes sensor substrate 401Q instead of sensor substrate 401P of sensor chip 4100P shown in FIG. 10 except that it. In FIG. 11, components identical to those of sensor chip 4100P shown in FIG. 10 are denoted by the same reference numerals. Sensor chip 4100Q shown in FIG. 11 is different from sensor chip 4100P shown in FIG. 10 in grooves 492 provided in an upper surface of sensor substrate 401Q. Grooves 492 divides connection part 403 into more parts.

This configuration effectively relieves stresses caused by the anodic bonding for the following reason. As shown in FIG. 4, movable electrode 411 is supported by beams 412a and 412b while movable electrode 421 is supported by beams 422a and 422b. The anodic bonding provides movable electrode 411 with stresses in a direction of the Y-axis while the anodic bonding provides movable electrode 421 with stresses in a direction of the X-axis. As shown in FIG. 11, the connection parts for adjustment on the short sides as well as the long sides of sensor chip 4100 effectively change the distribution of the stresses on movable electrodes 411 and 421.

Figure 12:
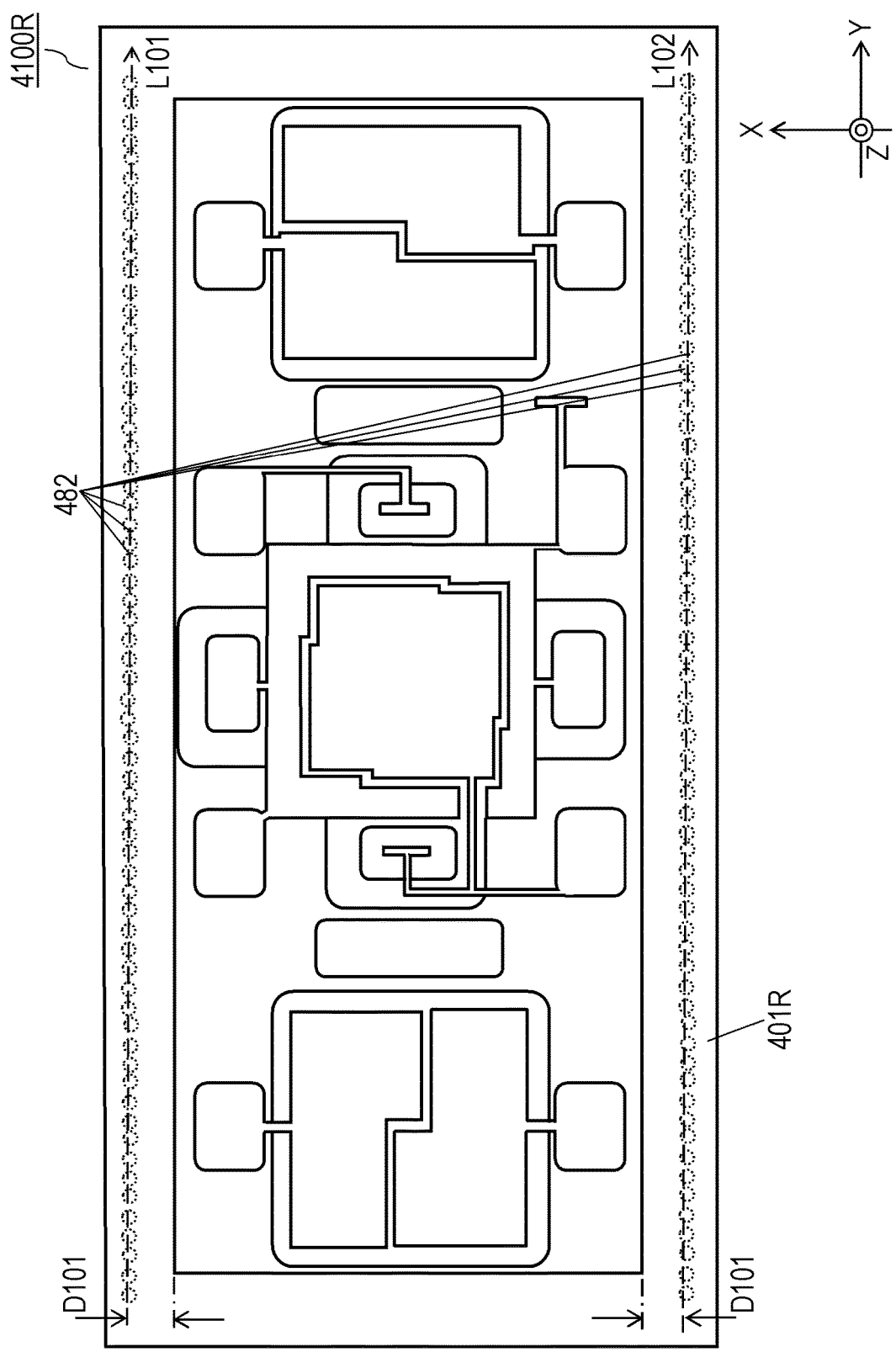
FIG. 12 is a top view of the sensor chip according to Embodiment 2.

FIG. 12 is a top view of sensor chip 4100R according to Embodiment 2. Sensor chip 4100R includes sensor substrate 401R instead of sensor substrate 401 of sensor chip 4100 shown in FIG. 9. In FIG. 12, components identical to those of sensor chip 4100 shown in FIGS. 1 to 9 are denoted by the same reference numerals. Sensor chip 4100R shown in FIG. 12 is different from sensor chip 4100 shown in FIG. 9 in plural parts 482 disposed in the upper surface of sensor substrate 401R. Each of parts 482 has a dot shape, and is apart from layer substrate 402a. Plural parts 482 can provide the same effect as parts 481 of sensor substrate 401 which are apart from the layer substrate 402a along the line shape, as shown in FIG. 9.

Parts 482 are disposed along straight lines L101 and L102.

Parts 482 are located away from the edge of connection part 403 by distance D101. In the case that distance D101 is not smaller than 50 μm, the airtightness of the inside of sensor chip 4100 can be retained. Distance D101 is preferably equal to or larger than 100 μm.

Parts 482 shown in FIG. 12 have circular shapes viewing from above; however, the parts are not limited to the circular shapes. Parts 482 may have rectangular shapes. Parts 482 are disposed in the same regions as parts 481 shown in FIG. 9.

Parts 481 of sensor substrate 401 and parts 482 of sensor substrate 401R can be formed in the following method. That is, connection part 403 is irradiated with laser light from above with a desired energy through layer substrate 402a, a glass substrate, thereby removing a part of layer substrate 402a corresponding to connection part 403 from layer substrate 402a. Parts 482 are formed by irradiating connection part 403 with laser light at predetermined space intervals along straight lines L101 and L102. Parts 481 of sensor substrate 401 are formed by irradiating the connection part with laser light with the irradiation-spots by the laser being partly overlapping one on another sequentially.

Grooves 491 can be formed simultaneously to the forming of a gap of sensor chip 4100, which eliminates the need for an additional process.

Straight lines L101 and L102 do not necessarily pass through the exact center of a corresponding one of the lines of parts 481. If a line can be drawn to pass through at least a part of the corresponding one of the lines of the parts apart from the layer substrate, such a line may be defined as the corresponding one of straight lines L101 and L102. Straight lines L101 and L102 do not necessarily pass through respective exact centers of corresponding parts 482 removed along a doted-line pattern. If a line can be drawn to pass through at least a part of respective dots of parts 482 apart along the doted-line pattern, such a line may be defined as the corresponding one of straight lines L101 and L102.

Parts 482 detached in the doted-line pattern may overlap each other viewing from above.

Exemplary Embodiment 3

In sensor 701 according to Exemplary Embodiment 3, fixed electrode 433a is electrically connected to columnar electrode 435a.

In Z-detection part 430, upon having an external acceleration with a component in the direction of the Z-axis applied thereto, movable electrode 431 is displaced. At this moment, both the distance between movable electrode 431 and fixed electrode 433a and the distance between movable electrode 431 and fixed electrode 433b are changed. This causes a change in capacitance between movable electrode 431 and fixed electrode 433a and a change in capacitance between movable electrode 431 and fixed electrode 433b. The acceleration can be detected based on these changes in capacitance. Fixed electrode 433b is electrically connected to columnar electrode 435b for taking the electric potential outside. For this reason, the capacitance between movable electrode 431 and fixed electrode 433b contains an extra capacitance as a parasitic capacitance due to columnar electrode 435b. In contrast, the capacitance between movable electrode 431 and fixed electrode 433a is contributed by no structure producing a parasitic capacitance. As a result, the capacitance between movable electrode 431 and fixed electrode 433a is different from the capacitance between movable electrode 431 and fixed electrode 433b. The difference in capacitance causes deterioration in characteristics, such as temperature characteristics, of sensor 701. In sensor 701, in order to dare to introduce a structure that can yield a parasitic capacitance, fixed electrode 433a is electrically to columnar electrode 435a. This configuration causes the capacitance between movable electrode 431 and fixed electrode 433a to be substantially equal to the capacitance between movable electrode 431 and fixed electrode 433b. This reduces the deterioration in the characteristics due to the difference in capacitance.

Exemplary Embodiment 4

Figure 13:
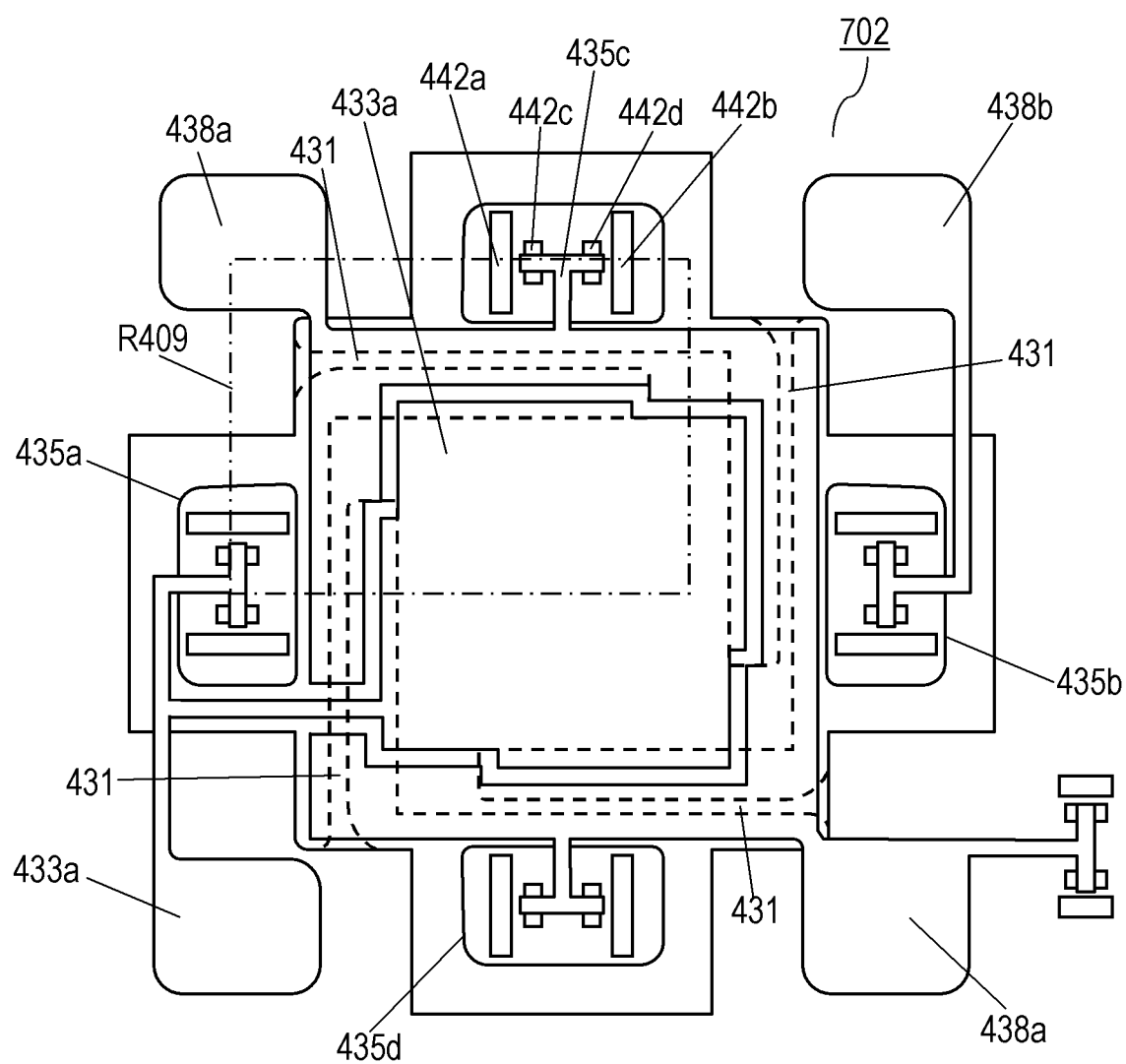
FIG. 13 is an enlarged view of a sensor according to Exemplary Embodiment 4.
Figure 14:
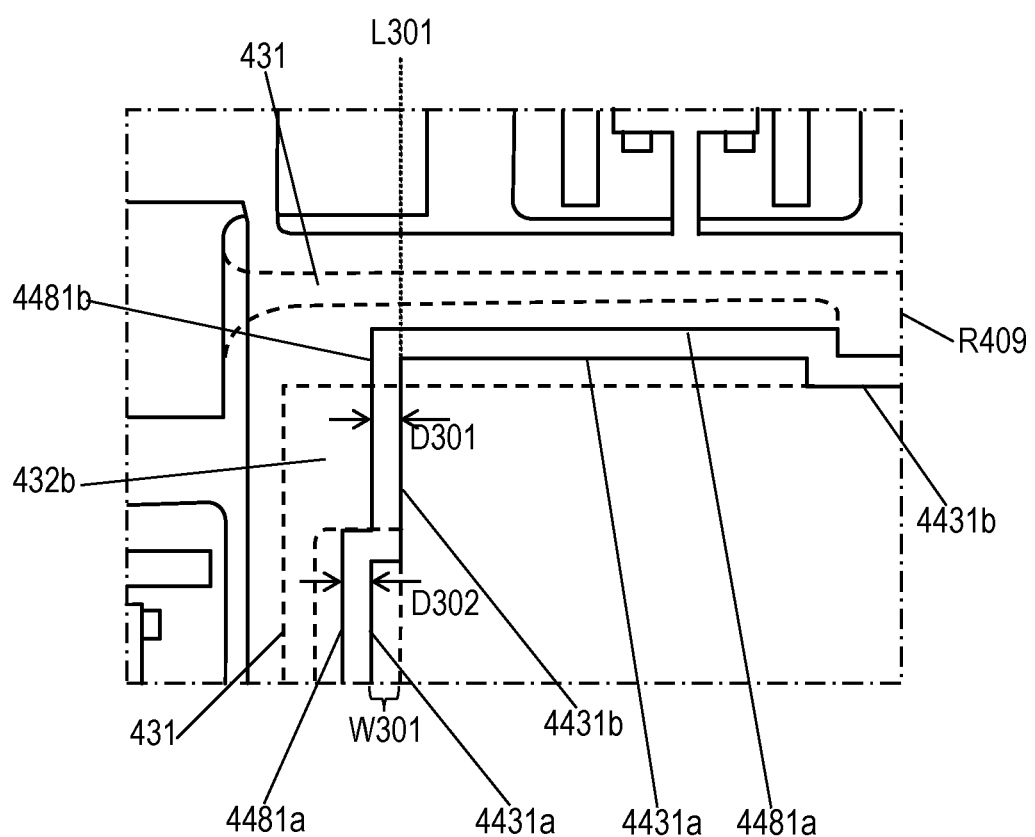
FIG. 14 is an enlarged view of the sensor shown in FIG. 13.

FIG. 13 is an enlarged view of sensor 702 according to Exemplary Embodiment 4 having substantially the same structure as sensor 701 according to Embodiment 1. FIG. 14 is an enlarged view of sensor 702 shown in FIG. 13 for illustrating region R409. Sensor 702 according to Embodiment 4 has basically the same as sensor 701 according to Embodiment 1 shown in FIGS. 1 to 7.

Fixed electrode 433a has side 4431a that is disposed on the outer side relative to the edge of movable electrode 431 and side 4431b that is set back inward relative to side 4431a viewing from above.

Side 4431a is located outside the edge of movable electrode 431 by width W301 viewing from above. In accordance with Embodiment 4, width W301 is 5 μm. In this configuration, even if a misalignment occurs between fixed electrode 433a and movable electrode 431, the capacitance between fixed electrode 433a and movable electrode 431 does not change, resulting in an increased accuracy of sensor 701.

Side 4431b is aligned with the edge of movable electrode 431 viewing from above. In FIG. 14, straight line L301 indicates the position of the edge of movable electrode 431. Straight line L301 serving as a boundary demarcates beam 432b from movable electrode 431. Beam 432b deforms to warp due to an external acceleration applied thereto. Accordingly, in the case where side 4431b is disposed closer to beam 432b than straight line L301 is, that is, fixed electrode 433a extends beyond straight line L301 to overlap beam 432b viewing from above, the deformation of beam 432b causes a change in capacitance between the beam and fixed electrode 433a, hence deteriorating accuracy of the sensor. In sensor substrate 401 according to Embodiment 1, side 4431b is aligned with the edge of movable electrode 431 viewing from above. That is, fixed electrode 433a does not extend beyond straight line L301 to overlap beam 432b viewing from above, hence preventing such a deteriorated accuracy.

Electrode 438a has side 4481a facing side 4431a of fixed electrode 433a, and side 4481b facing side 4431b of fixed electrode 433a.

Distance D301 between side 4431a of fixed electrode 433a and side 4481a of electrode 438a is substantially equal to distance D302 between side 4431b of fixed electrode 433a and side 4481b of electrode 438a. Electrode 438a does not only preventing the occurrence of sticking described earlier but also stabilizing the capacitance.

Exemplary Embodiment 5

Figure 15:
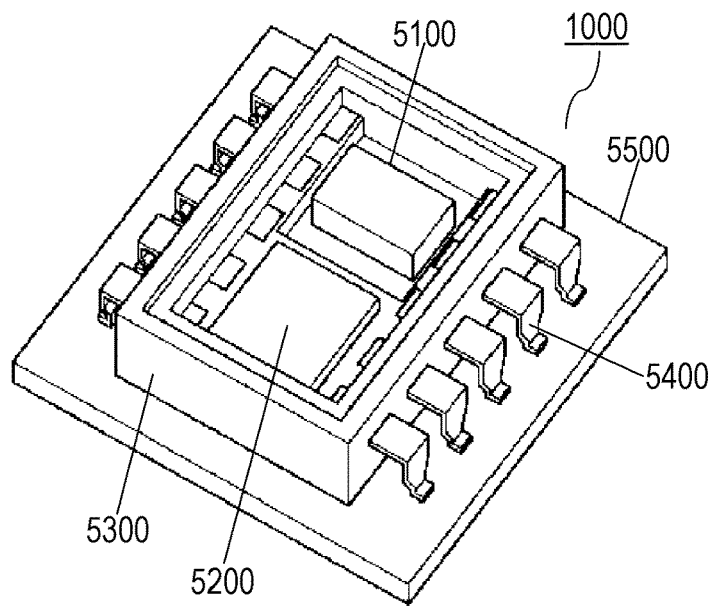
FIG. 15 is a perspective view of a sensor according to Exemplary Embodiment 5.

FIG. 15 is a perspective view of sensor 1000 according to Exemplary Embodiment 5. Sensor 1000 includes package 5300 and a lid covering package 5300. In FIG. 15, the lid of package 5300 is not shown. Package 5300 accommodates sensor chip 5100 and integrated circuit 5200 for performing various calculations based on outputs from sensor chip 5100. In accordance with Embodiment 5, sensor 1000 is an acceleration sensor for detecting acceleration, and integrated circuit 5200 is an application-specific integrated circuit (ASIC).

Terminals 5400 are led out from package 5300 to be connected to external board 5500.

Sensor 1000 is a capacitance-type acceleration sensor, and is manufactured by micro-electromechanical system (MEMS) technology. For detecting acceleration in the directions of the three axes, i.e. an X-axis, a Y-axis, and a Z-axis perpendicular to each other, three weights, i.e., movable electrodes, for detecting the acceleration in these axes are disposed in sensor chip 5100.

Figure 16:
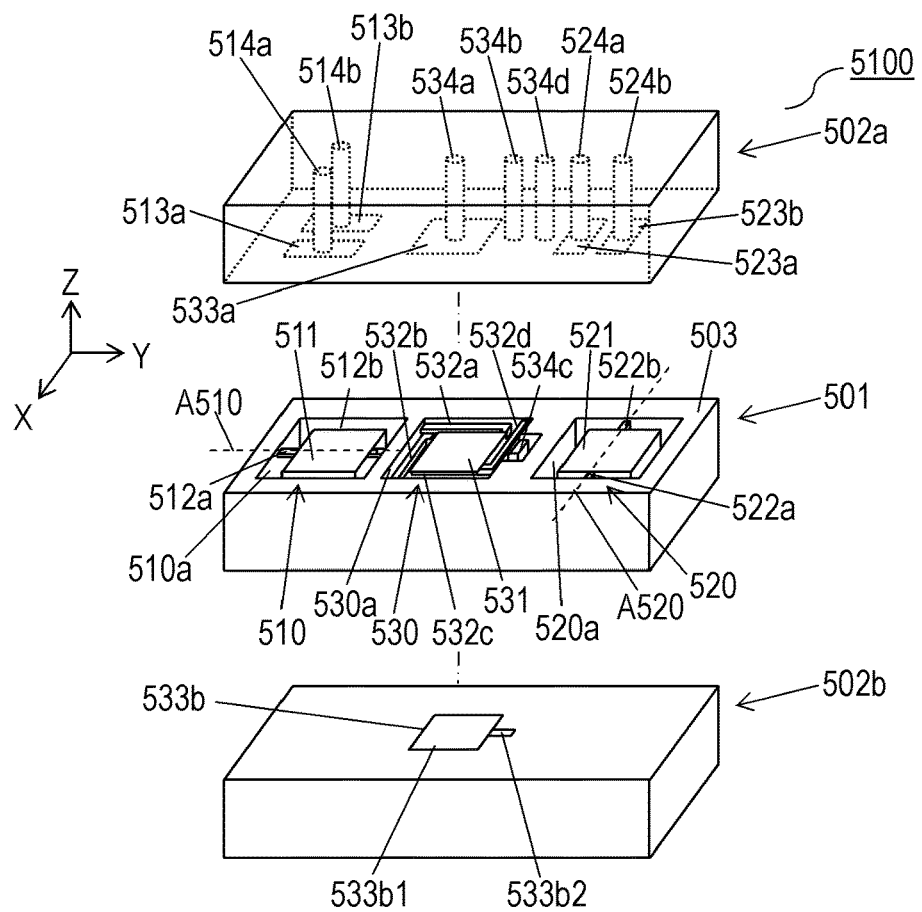
FIG. 16 is an exploded perspective view of a sensor chip of the sensor according to Embodiment 5.

FIG. 16 is an exploded perspective view of sensor chip 5100.

Sensor chip 5100 includes sensor part 501, layer substrate 502a joined to an upper surface of sensor part 501, and layer substrate 502b joined to a lower surface of sensor part 501. Sensor part 501 is sandwiched between layer substrates 502a and 502b. Sensor part 501 is made of, e.g. a silicon-on-insulator (SOI) substrate. Layer substrates 502a and 502b are made of insulating material, such as glass.

Sensor part 501 includes frame part 503. Frame part 503 includes rectangular frames 510a, 520a, and 530a which are arranged in a line.

Movable electrode 511 is disposed inside rectangular frame 510a. Movable electrode 521 is disposed inside rectangular frame 520a. Movable electrode 531 is disposed inside rectangular frame 530a.

Sensor part 501 includes: X-detection part 510 detecting acceleration in a direction of the X-axis, Y-detection part 520 detecting acceleration in a direction of the Y-axis, and Z-detection part 530 detecting acceleration in a direction of the Z-axis. The X-axis is in parallel with both the upper and lower surfaces of sensor chip 5100. The Y-axis is in parallel with both the upper and lower surfaces of sensor chip 5100 and is perpendicular to the X-axis. The Z-axis is perpendicular to both the X-axis and the Y-axis, that is, perpendicular to both the upper and lower surfaces of sensor chip 5100.

X-detection part 510 includes beams 512a and 512b, movable electrode 511, and fixed electrodes 513a and 513b.

Beams 512a and 512b are connected to rectangular frame 510a to support movable electrode 511.

Beams 512a and 512b are arranged along straight line A510 in parallel with the Y-axis. An upper surface of movable electrode 511 is divided into two sections by straight line A510. Fixed electrode 513a faces one of the two sections of the upper surface of movable electrode 511 in the direction of the Z-axis with a space between fixed electrode 513a and movable electrode 511. Fixed electrode 513b faces the other of the two sections of the upper surface of movable electrode 511 in the direction of the Z-axis with a space between fixed electrode 513a and movable electrode 511.

X-detection part 510 detects acceleration in a direction of the X-axis based on both changes in capacitance between movable electrode 511 and fixed electrode 513a and changes in capacitance between movable electrode 511 and fixed electrode 513b.

Y-detection part 520 includes beams 522a and 522b, movable electrode 521, and fixed electrodes 523a and 523b. Y-detection part 520 has the same structure as X-detection part 510 with the structure being identical to that obtained by rotating X-detection part 510 on itself by 90 degrees. Each of the constituent members of Y-detection part 520 is the same in shape as the corresponding one of those of X-detection part 510.

That is, Y-detection part 520 includes beams 522a and 522b, movable electrode 521, and fixed electrodes 523a and 523b.

Beams 522a and 522b are connected to rectangular frame 520a and support movable electrode 521.

Beams 522a and 522b are arranged along straight line A520 in parallel with the X-axis. An upper surface of movable electrode 521 is divided into two sections by straight line A520. Fixed electrode 523a faces one of the two sections of the upper surface of movable electrode 521 in a direction of the Z-axis with a space between fixed electrode 523a and movable electrode 521. Fixed electrode 523b faces the other of the two sections of the upper surface of movable electrode 521 in the direction of the Z-axis with a space between fixed electrode 523b and movable electrode 521.

Y-detection part 520 detects acceleration in a direction of the Y-axis based on both changes in capacitance between movable electrode 521 and fixed electrode 523a and changes in capacitance between movable electrode 521 and fixed electrode 523b.

In Z-detection part 530, beams 532a, 532b, 532c, and 532d are connected to rectangular frame 530a and support movable electrode 531. Fixed electrode 533a faces an upper surface of movable electrode 531 in the direction of the Z-axis with a space between fixed electrode 533a and movable electrode 531. Fixed electrode 533b faces a lower surface of movable electrode 531 in the direction of the Z-axis with a space between fixed electrode 533b and movable electrode 531.

Z-detection part 530 detects acceleration in a the direction of the Z-axis based on both changes in capacitance between movable electrode 531 and fixed electrode 533a and changes in capacitance between movable electrode 531 and fixed electrode 533b.

Figure 17A:
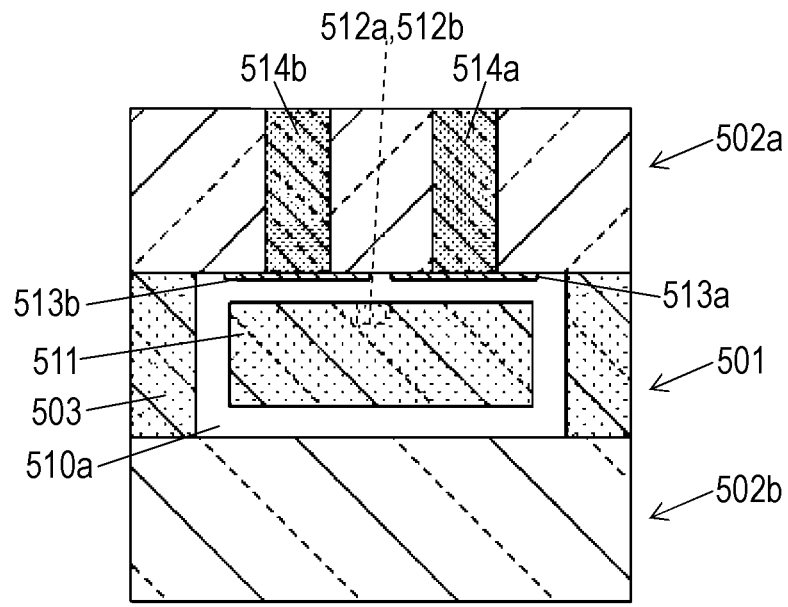
FIG. 17A is a cross-sectional view of an X-detection part of the sensor chip according to Embodiment 5.
Figure 17B:
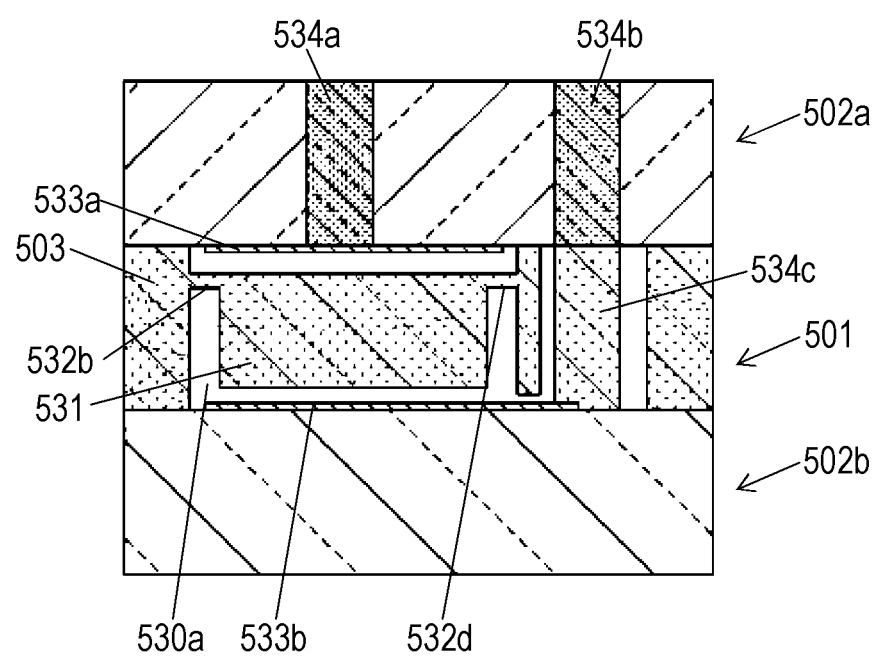
FIG. 17B is a cross-sectional view of a Z-detection part of the sensor chip according to Embodiment 5.

FIG. 17A is a cross-sectional view of X-detection part 510. FIG. 17B is a cross-sectional view of Z-detection part 530. A cross section of Y-detection part 520 is identical to that of X-detection part 510.

Fixed electrode 513a and fixed electrode 513b are led out to the upper surface of layer substrate 502a through via-electrode 514a and via-electrode 514b, respectively.

Fixed electrode 533a is disposed on a portion of layer substrate 502a facing movable electrode 531. Fixed electrode 533b is disposed on a portion of layer substrate 502b facing movable electrode 531. This configuration causes electrical signals from fixed electrode 533a to be led out to the upper surface of layer substrate 502a through via-electrode 534a.

Fixed electrode 533b includes projection 533b2 that protrudes from rectangular region 533b1 (see FIG. 16). Projection 533b2 is connected to columnar fixed electrode 534c that is separated away from movable electrode 531. Columnar fixed electrode 534c is connected to via-electrode 534b that is disposed in layer substrate 502a. This configuration allows electrical signals from fixed electrode 533b to be led out to the upper surface of layer substrate 502a through columnar fixed electrode 534c and via-electrode 534b.

An operation of sensor 702 which detects acceleration in a direction of the X-axis will be described below. Capacitance C between electrodes is calculated with the dielectric constant ε of a portion between a movable electrode and a fixed electrode, The area S of a portion of the movable electrode facing the fixed electrode, the gap d between the movable electrode and the fixed electrode facing each other as $C=\varepsilon S/d$. Upon either rotation or displacement of the movable electrode caused by acceleration, gap d changes, which in turn changes capacitance C. Thus, integrated circuit 5200 converts capacitance C into a voltage by capacitance-to-voltage (CV) conversion. Integrated circuit 5200 reduces the influence of a force on axes out of the tree axes other than the axis on which the acceleration is detected.

Figure 18:
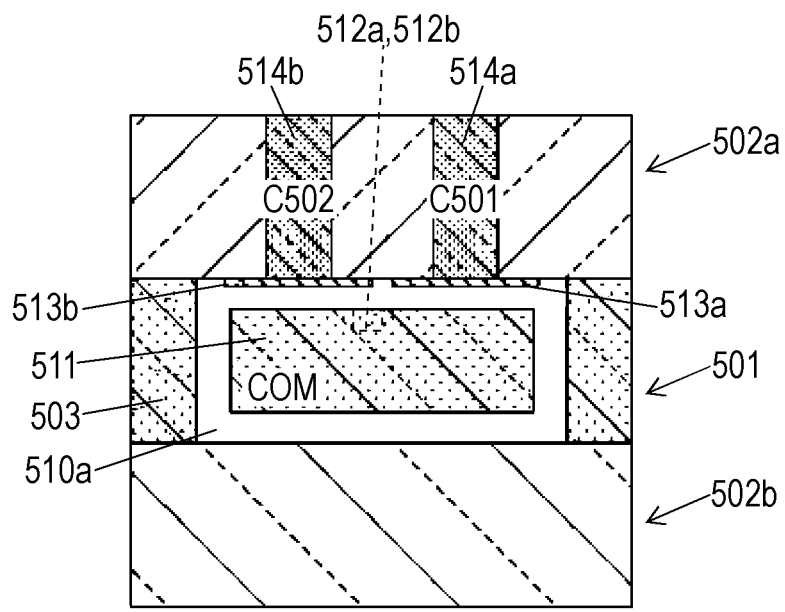
FIG. 18 is a cross-sectional view of the X-detection part having no acceleration in an X-direction applied thereto.
Figure 19:
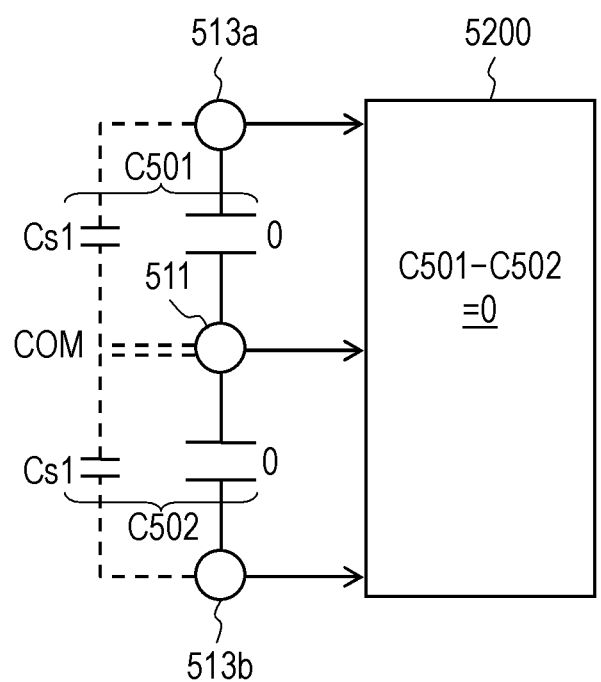
FIG. 19 is a circuit diagram of the X-detection part shown in FIG. 18.

FIGS. 18 and 19 are a cross-sectional view and a circuit diagram of X-detection part 510, respectively, which does not have acceleration applied thereto in a direction of the X-axis. In the case where no acceleration is applied in the direction of the X-axis, as shown in FIG. 19, capacitance C501 between movable electrode 511 and fixed electrode 513a is equal to capacitance C502 between movable electrode 511 and fixed electrode 513b. Each of these capacitances is parasitic capacitance Cs1 between movable electrode 511 and respective one of fixed electrodes 513a and 513b. Integrated circuit 5200 calculates a difference value (C501−C502=0) between capacitance C501 and capacitance C502, and outputs the value as an X-output that indicates the acceleration in the direction of the X-axis.

Figure 20:
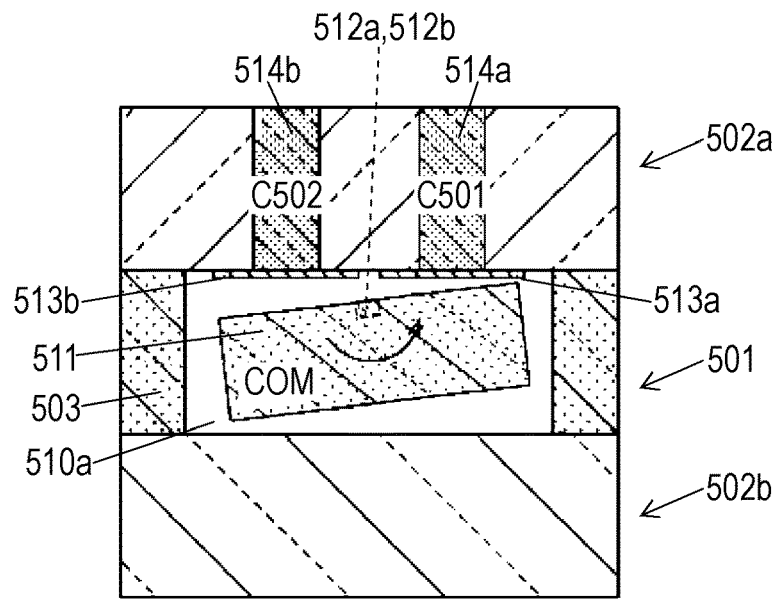
FIG. 20 is a cross-sectional view of the X-detection part having an acceleration in the X-direction applied thereto.
Figure 21:
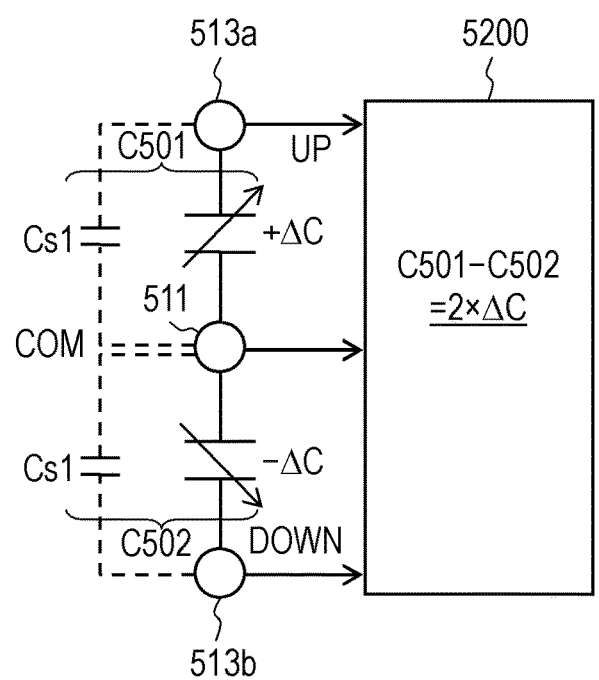
FIG. 21 is a circuit diagram of the X-detection part shown in FIG. 20.

FIGS. 20 and 21 are a cross-sectional view and a circuit diagram of X-detection part 510, respectively, which has acceleration of 1 G applied thereto in a direction of the X-axis. In this case, as shown in FIG. 21, capacitance C501 between movable electrode 511 and fixed electrode 513a is equal to the sum (Cs1+ΔC) of parasitic capacitance Cs1 and change ΔC. Capacitance C502 between movable electrode 511 and fixed electrode 513b is equal to the difference (Cs1−ΔC) obtained by subtracting changeΔC from parasitic capacitance Cs1. Integrated circuit 5200 calculates the difference value (C501−C502=2×ΔC) between capacitance C501 and capacitance C502, and outputs the value as an X-output.

X-detection part 510 thus detects the acceleration in the X-direction based on changes in the capacitance. Y-detection part 520 detects the acceleration in the direction of the Y-axis, similarly to X-detection part 510.

Figure 22:
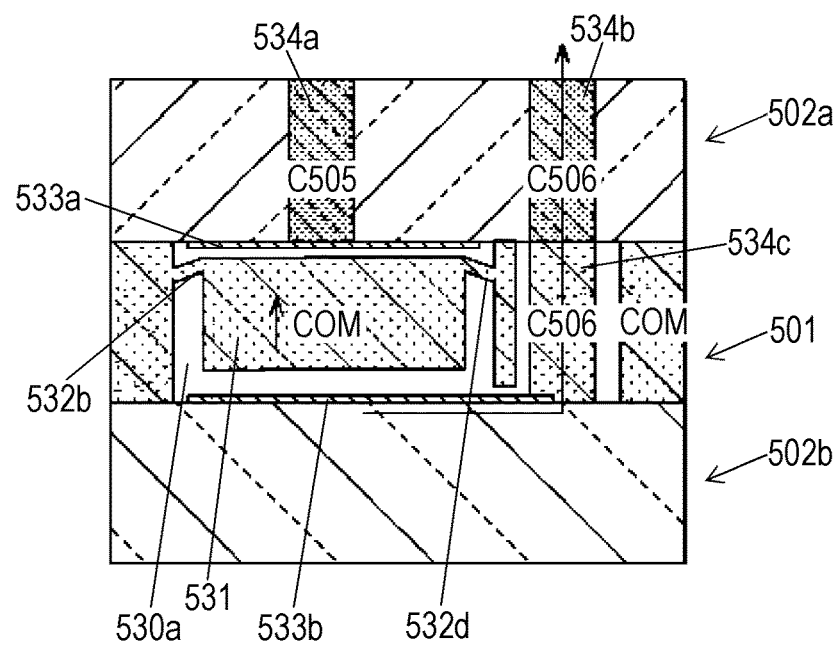
FIG. 22 is a cross-sectional view of a Z-detection part having an acceleration in a Z-direction applied thereto.
Figure 23:
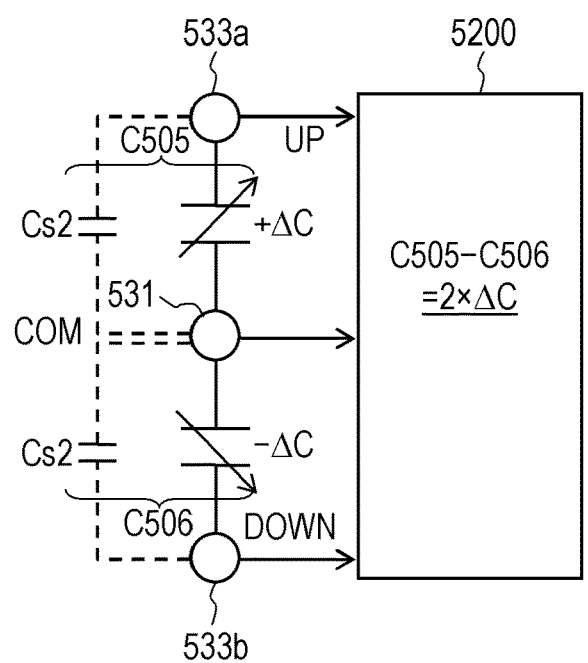
FIG. 23 is a circuit diagram of the Z-detection part shown in FIG. 22.

FIGS. 22 and 23 are a cross-sectional view and a circuit diagram of Z-detection part 530, respectively, which has acceleration of 1 G applied thereto in a direction of the Z-axis. In this case, as shown in FIG. 23, capacitance C505 between movable electrode 531 and fixed electrode 533a is equal to a sum (Cs2+ΔC) of parasitic capacitance Cs2 and change ΔC. Capacitance C506 between movable electrode 531 and fixed electrode 533b is equal to a difference (Cs2−ΔC) obtained by subtracting change ΔC from parasitic capacitance Cs2. Integrated circuit 5200 calculates the difference value (C505−C506=2×ΔC) between capacitance C505 and capacitance C506, and outputs the value as a Z-output that indicates the acceleration in the direction of the Z-axis. Z-detection part 530 thus detects the acceleration in the Z-direction based on changes in capacitance.

The axis out of the three axes in the direction on which acceleration is detected is defined as a main axis. Each of axes out of the three axes other than the main axis is defined as one other axis. In an acceleration sensor, the following situation may be observed. That is, while acceleration in a direction of the main axis is applied, if the acceleration in a direction of one other axis is further applied, the output corresponding to the direction of the main axis indicates a value that is different from actual acceleration in the direction of the main axis. In order to reduce such a detection error, integrated circuit 5200 includes a correction circuit. The correction circuit reduces an influence of acceleration in the direction of one other axis on the output that indicates the acceleration in the direction of the main axis.

The operation of sensor 1000 will be described as a reference state and a correction state. The reference state is a case that no acceleration is applied in directions of other axes. The correction state is a case that acceleration is applied in a direction of one other axis and a correction is necessary. The operation of sensor 1000 will be described in the case where the X-axis is the main axis while the Z-axis is the one other axis.

1. Reference State

Figure 24A:
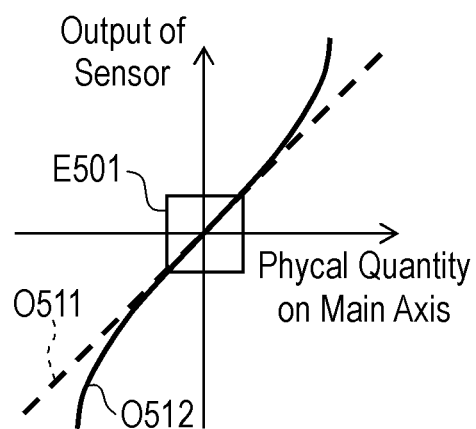
FIG. 24A illustrates an output of the sensor according to Embodiment 5 that indicates acceleration in a direction of a main axis.
Figure 24B:
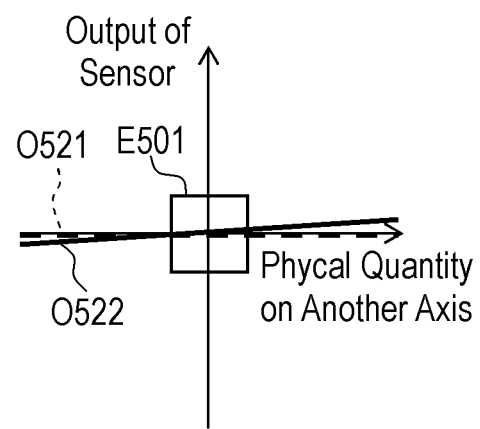
FIG. 24B illustrates an output of the sensor according to Embodiment 5 that indicates acceleration in a direction of another axis.
Figure 24C:
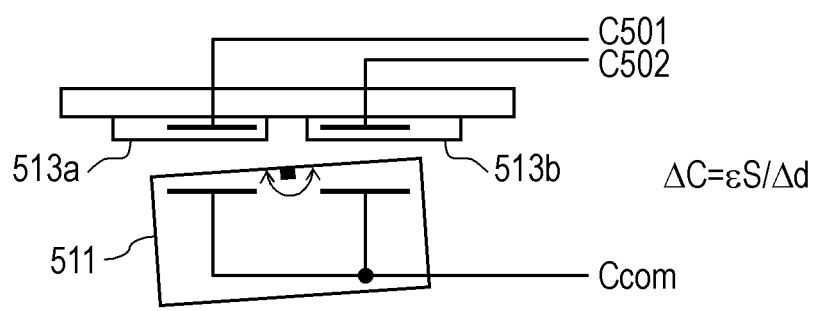
FIG. 24C is a schematic cross-sectional view of the X-detection part of the sensor according to Embodiment 5.

FIG. 24A illustrates an output of X-detection part 510 in the reference state while the output indicates acceleration in a direction of the X-axis, i.e. the main axis, of sensor 1000. FIG. 24B illustrates an output of Z-detection part 530 while the output indicating acceleration in the direction of the Z-axis, i.e. the one other axis. FIG. 24C is a cross-sectional view of X-detection part 510 that is detecting the acceleration in the direction of the X-axis, i.e. the main axis. In the figures, straight lines O511 and O521 indicate ideal outputs while curved lines O512 and O522 indicate actual outputs. That is, the output of an ideal sensor is proportional to the applied acceleration; however, the actual output contains error. For this reason, only the output within linear region E501 in which the output is proportional to the applied acceleration may be used. Alternatively, in addition to this, the output outside linear region E501 may also be used after being corrected by integrated circuit 5200.

2. Correction State

Figure 25A:
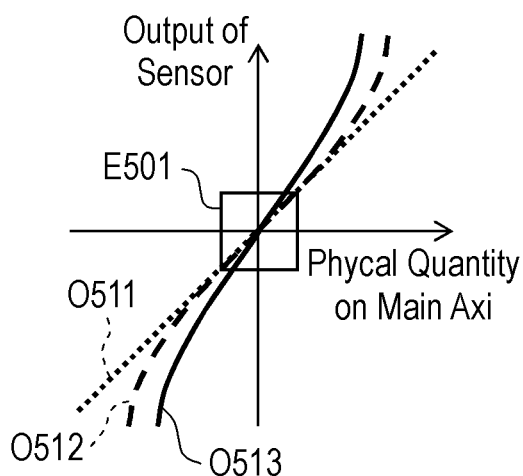
FIG. 25A illustrates output characteristics of the sensor according to Embodiment 5 that indicate acceleration in the direction of the main axis.
Figure 25B:
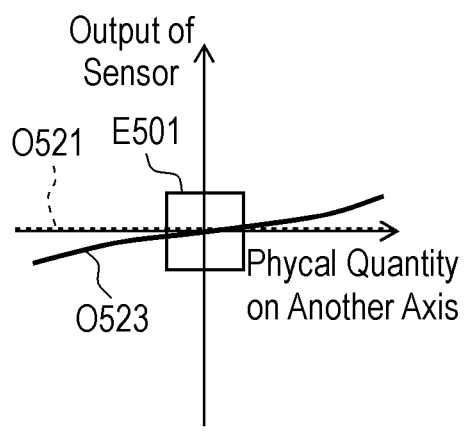
FIG. 25B illustrates output characteristics of the sensor according to Embodiment 5 that indicate acceleration in the direction of another axis.
Figure 25C:
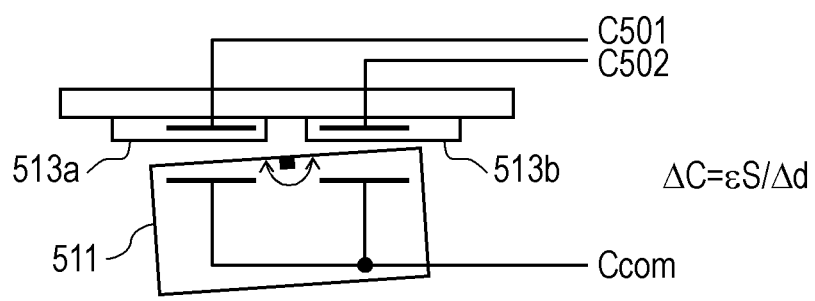
FIG. 25C is a schematic cross-sectional view of the X-detection part of the sensor according to Embodiment 5.

FIG. 25A illustrates an output of X-detection part 510 in the correction state while the output indicates acceleration in the direction of the X-axis, i.e. the main axis. FIG. 25B is a graph showing an output of Z-detection part 530 in the correction state while the output indicates acceleration in the direction of the Z-axis, i.e. the one other axis. FIG. 25C is a cross-sectional view of X-detection part 510 in the correction state. In the correction state, as shown in FIG. 25B, influence of the one other axis is relatively large. Therefore, as shown in FIG. 25A, the difference between curved line O513 that indicates the output for the main axis and straight line O511 that indicates an ideal output is larger than that in the reference state.

In this case, as shown in FIG. 25C, movable electrode 511 is tilted largely and reduces gap d accordingly. Such small gap d increases change ΔC, and increases sensitivity accordingly.

Figure 26:
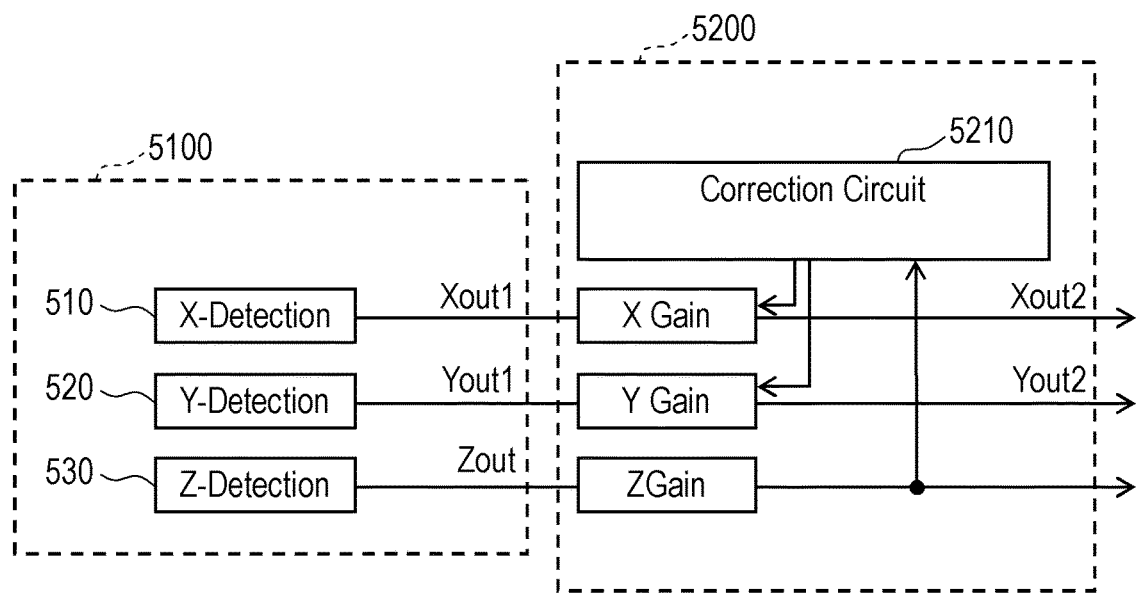
FIG. 26 is a functional block diagram of the sensor according to Embodiment 5.

FIG. 26 is a functional block diagram of sensor 1000 according to Embodiment 5. Integrated circuit 5200 includes correction circuit 5210 that corrects the sensitivity for the axes. The sensitivity changes according to the change of gap d. An operation of correction circuit 5210 will be described below.

First, an operation of a comparative example e of a correction circuit will be described below. The correction circuit of the comparative example corrects output Xout1 supplied from X-detection part 510 to provide output Xout2 while the output is produced in accordance with acceleration in the direction of the X-axis, the main axis. Output Xout2 is a signal that is obtained by subtracting an other-axis sensitivity from output Xout1. The other-axis sensitivity is an offset that is contained in output Xout1. The offset results from the acceleration in the direction of the Z-axis, i.e. the one other axis. The correction circuit of the comparative example provides output Xout2 by Equation 1 with a correction coefficient AGCcode and the output Zout supplied from Z-detection part 530 in accordance with the acceleration in the direction of the Z-axis, the one other axis.

$$Xout2 = Xout1/(1-AGCcode \times Zout) \quad (1)$$

The correction circuit of the comparative example corrects output Xout1 by changing correction factor (1/(1−AGCcode×Zout)). Specifically, output Xout1 is lineally corrected such that output Xout1 is amplified when output Zout is positive and that output Xout1 is attenuated when output Zout is negative.

Figure 27:
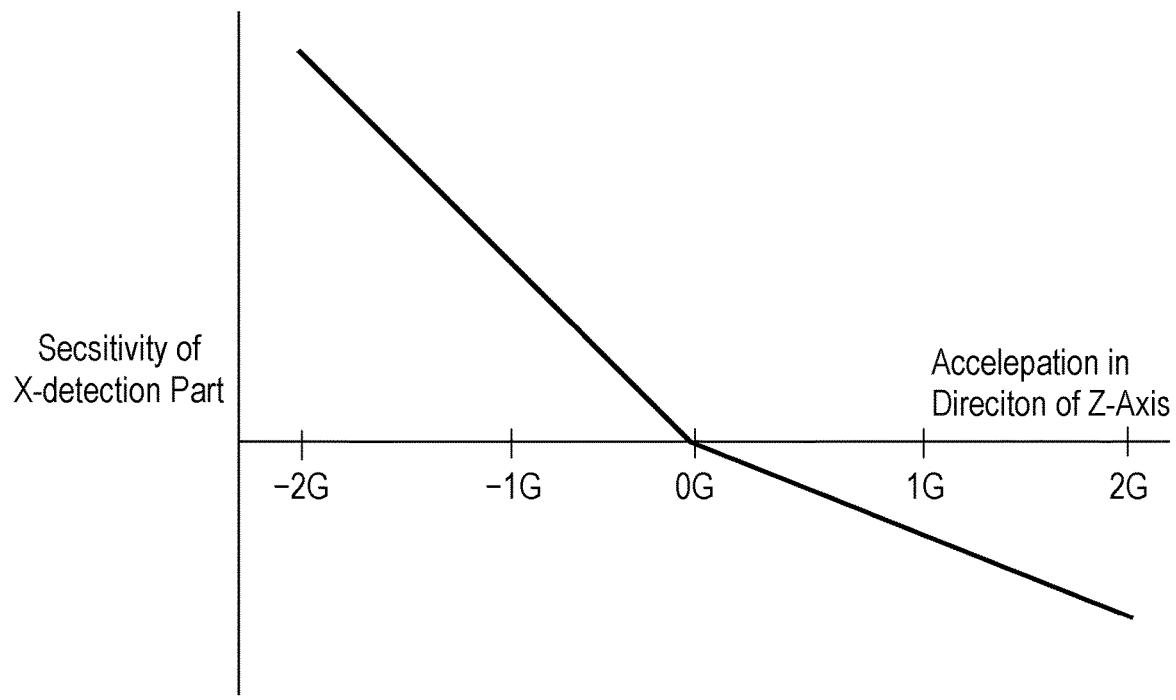
FIG. 27 illustrates an output of the X-detection part of the sensor according to Embodiment 5.

FIG. 27 illustrates a sensitivity of X-detection part 510 for the acceleration in the direction of the X-axis, i.e. the main axis with respect to the acceleration in the direction of the Z-axis, i.e. the one other axis. As shown in FIG. 27, experimental results have shown that changes in sensitivity of X-detection part 510 are different depending on whether the acceleration applied in parallel with the Z-axis is positive or negative. The changes in sensitivity results from changes in gap d of X-detection part 510 caused by the acceleration applied to the Z-direction. Capacitance C determined by C=εS/d is inversely proportional to gap d. For this reason, negative acceleration in the Z-axis, i.e. acceleration in the negative direction of the Z-axis applied thereto decreases gap d, and increase a change in the sensitivity for the acceleration in the direction of the X-axis. Conversely, positive acceleration in the Z-axis, i.e. acceleration in the positive direction opposite to the negative direction of the Z-axis increases gap d, and decreases a change in the sensitivity for the acceleration in the direction of the X-axis. For this reason, the change in the sensitivity of X-detection part 510 is different depending on the direction of the acceleration in parallel with the Z-axis.

Figure 28A:
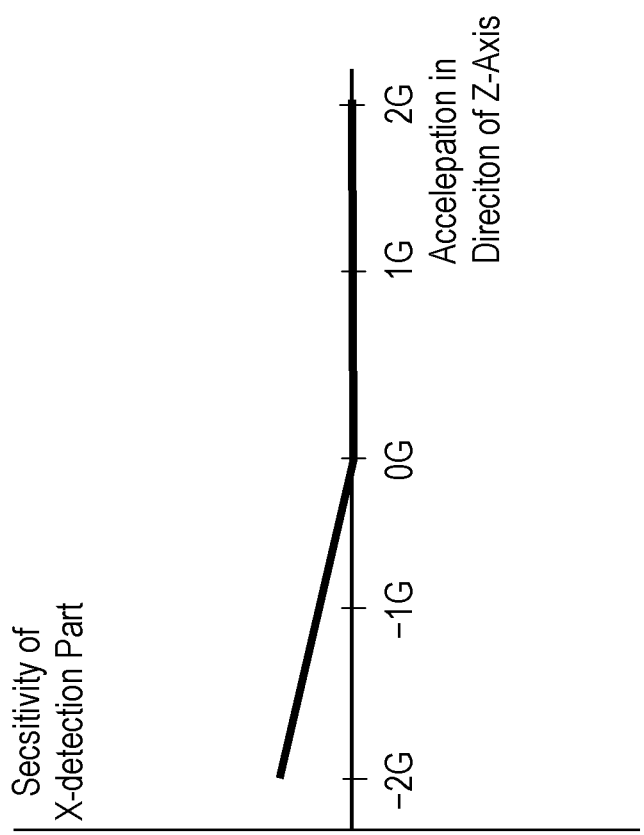
FIG. 28A illustrates an output that is obtained by correcting an output of an X-detection part with a correction circuit of a sensor of a comparative example.
Figure 28B:
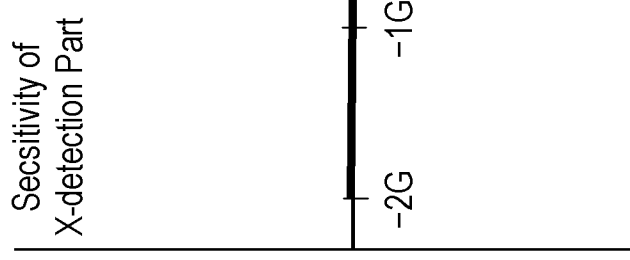
FIG. 28B illustrates an output obtained by correcting the output of the X-detection part with the correction circuit of the sensor of the comparative example.

FIGS. 28A and 28B illustrate outputs obtained by correcting outputs of X-detection part 510 obtained by the correction circuit of the sensor of the comparative example. The correction is made by Equation 1 used in the correction circuit of the sensor of the comparative example as follows. In the case that correction coefficient AGCcode is determined by calculation based on the acceleration in the positive direction of the Z-axis such that the change in sensitivity for the acceleration in the direction of the X-axis becomes zero, the resulting correction is as follows: The sensitivity for the acceleration in the direction of the X-axis changes against the acceleration in the negative direction of the Z-axis, not correcting output Xout1 properly, as shown in FIG. 28A. In contrast, in the case that correction coefficient AGCcode is determined by calculation based on the acceleration in the negative direction of the Z-axis such that the change in sensitivity for the acceleration in the direction of the X-axis becomes zero, the resulting correction is as follows: The sensitivity changes against the acceleration in the positive direction of the Z-axis, not correcting output Xout1 properly, as shown in FIG. 28B.

Correction circuit 5210 of sensor 1000 according to Embodiment 5 is configured such that an equation for use in correction is changed in accordance with the direction of the acceleration in parallel with the Z-axis. Specifically, correction circuit 5210 operates as follows: In cases where the acceleration in parallel with the Z-axis is in the positive direction of the Z-axis (Zout>0), the following Equation 2 including weighting variable W501 is used to correct output Xout1 of X-detection part 510, thereby providing output Xout2. In contrast, in cases where the acceleration is in not the positive direction, that is, in the negative direction of the Z-axis (Zout≤0), the following Equation 3 including weighting variable W502 is used to correct output Xout1 of X-detection part 510, thereby providing output Xout2.

$$Xout2 = Xout1/(1-AGCcode \times Zout \times W501) \ (Zout>0) \quad (2)$$

$$Xout2 = Xout1/(1-AGCcode \times Zout \times W502) \ (Zout \le 0) \quad (3)$$

Weighting variables W501 and W502 are variables for weighing the correction coefficient, and are determined in the following manner.

In FIG. 27, positive-side sensitivity Sp is determined. Positive-side sensitivity Sp is the sensitivity of X-detection part 510 for acceleration in the direction of the X-axis when acceleration of a certain magnitude in the positive direction of the Z-axis is being applied. Similarly, negative-side sensitivity Sn is determined. Negative-side sensitivity Sn is the sensitivity of X-detection part 510 for acceleration in the direction of the X-axis when acceleration of the magnitude equal to that of the negative direction of the Z-axis is applied.

In cases where output Xout2 after correction is used to indicate the acceleration in the direction of the X-axis when acceleration in the positive direction of the Z-axis is applied, weighting variables W501 and W502 are determined such that W501=1 and W502=Sp/Sn. That is, weighting variable W501 is used to provide no weight, while only weighting variable W502 is used to provide the weight.

In cases where output Xout2 after correction is used to indicate the acceleration in the direction of the X-axis when acceleration in the negative direction of the Z-axis is applied, weighting variables W501 and W502 are determined such that W501=Sp/Sn and W502=1. That is, weighting variable W501 is used to provide the weight while weighting variable W502 is used to provide no weight.

The term, "an equation for use in correction is changed in accordance with positive and negative (direction) of acceleration in the direction of the Z-axis" used herein means that "at least two equations are usable for cases where the acceleration in the direction of the Z-axis is positive and negative." The term does not mean "only equations, i.e. one is used for cases where the acceleration in the direction of the Z-axis is positive and the other is used for cases where the acceleration is negative, with a boundary corresponding to the acceleration of zero."

A selection of one from the equations may be made so as to choose which of the directions, i.e. positive and negative, of acceleration in the Z-axis is used to calculate output Xout2 that can correctly correspond to the acceleration to be measured. This configuration accurately reduces the influence of the acceleration in the one other axis regardless of positive and negative signs (directions) the acceleration in the Z-axis, i.e. of the one other axis. In other words, the influence of the acceleration in the direction of one other axis on the output that indicates the acceleration in the direction of the main axis can be relieved to improve the output characteristics of the detection part for detecting the acceleration in the main axis.

In this above case, the equation for use in correction is changed in accordance with the sign (direction) of the acceleration in the Z-axis. However, correction circuit 5210 may correct output Xout1 in the following way that uses other equations.

First, values of the sensitivity of X-detection part 510 is measured for different cases where different measurement of acceleration with a certain identical magnitude is carried out for different acceleration directions, i.e. the positive and the negative in the Z-axis. Next, the average of the measured values of the sensitivity of X-detection part 510 is determined to be a target value. Then, using the following Equation 4, correction coefficient AGCcode1 is determined such that output Xout21 becomes equal to the target value.

$$Xout21 = Xout1/(1 - AGCcode1 \times Zout) \quad (4)$$

Figure 29A:
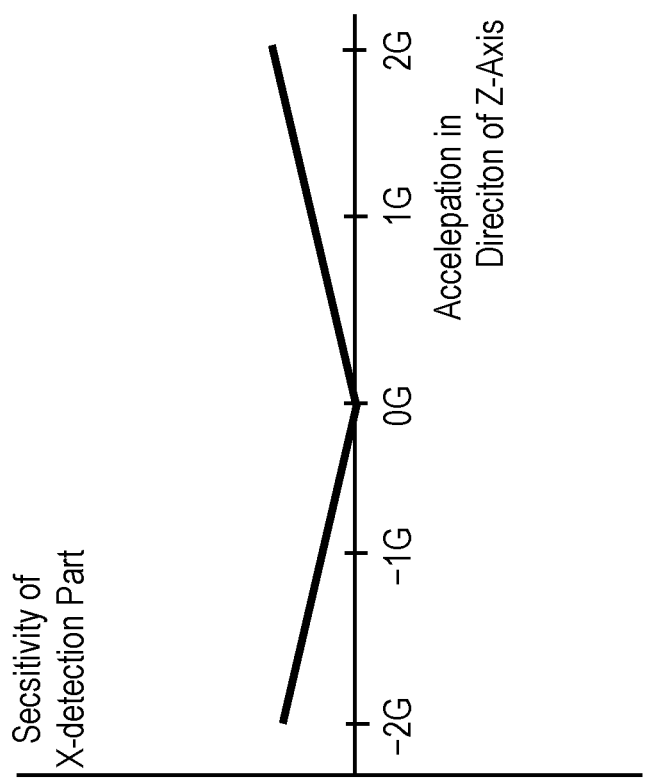
FIG. 29A illustrates an output obtained by correcting an output of the X-detection part with another correction circuit of the sensor according to the embodiment.

FIG. 29A illustrates the output characteristics of X-detection part 510 obtained by using Equation 4.

Next, output Xout21 which has been corrected by Equation 4 is corrected by Equation 5 with correction coefficient AGCcode2 to yield output Xout22.

$$Xout22 = Xout21/(1 + |AGCcode2 \times Zout|) \quad (5)$$

Figure 29B:
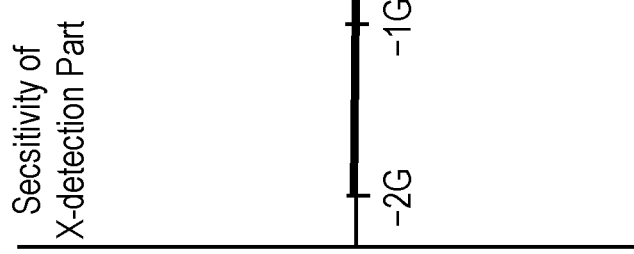
FIG. 29B illustrates output obtained by correcting the output of the X-detection part with the correction circuit shown in FIG. 29A.

Similarly to Equation 3, Equations 4 and 5 can relieve the influence of the acceleration in the direction of the one other axis on the output that indicates the acceleration in the direction of the main axis, thereby improving the output characteristics in the main axis. FIG. 29B illustrates the output characteristics of output Xout22 that is corrected by using Equation 5.

The sensitivity of Y-detection part 520 can be corrected by the same method as the correction of the sensitivity of X-detection part 510.

In accordance with Embodiment 5, the X-axis (Y-axis) is the main axis while the Z-axis is the one other axis; however, the main axis and the one other axis may be appropriately changed.

In accordance with Embodiment 5, three units of MEMS structures (X-detection part 510, Y-detection part 520, and Z-detection part 530) are disposed in the single chip while each of the three units is used for detecting acceleration in the corresponding one of the three axes, i.e. the X-axis, Y-axis, and Z-axis. However, even in cases where one unit of the MEMS structures provides three outputs, the output in the main axis can be corrected in accordance with the output in one other axis while the three outputs are the output indicating acceleration in the direction in the X-axis, output indicating acceleration in the direction in the Y-axis, and output indicating acceleration in the direction in the Z-axis.

Sensor chip 5100 may be appropriately modified in, e.g. shape, size, or arrangement.

The material of the via-electrodes is conductive material, such as silicon, tungsten, or copper. The material of a part surrounding and holding the via-electrodes is insulating material, such as glass.

The shape of beams 532a, 532b, 532c, and 532d is not necessarily the L-shape; however, the L-shape preferably allows beams 532a, 532b, 532c, and 532d to have large lengths.

Correction circuit 5210 preferably performs arithmetic corrections with a digital circuit. Arithmetic corrections with the digital circuit can perform various kinds of corrections including sensitivity adjustment and offset adjustment, for example.

In Embodiments 1 to 5, terms, such as "upper surface," "lower surface," "upper," and "lower", indicating directions indicates relative directions determined depending only on relative positional relation of constituent elements, such as a sensor substrate, of the sensor, and do not indicate absolute directions, such as a vertical direction.

REFERENCE MARKS IN THE DRAWINGS 401 sensor substrate
402a layer substrate (first layer substrate)
402b layer substrate (second layer substrate)
403 connection part
410 X-detection part
410a rectangular frame
411 movable electrode
412a, 412b beam
413a, 413b fixed electrode
414a, 414b via-electrode
420 Y-detection part
420a rectangular frame
421 movable electrode
422a, 422b beam
423a, 423b fixed electrode
424a, 424b via-electrode
430 Z-detection part
430a rectangular frame
431 movable electrode
432a, 432b, 432c, 432d beam
433a, 433b fixed electrode
434a, 434b via-electrode
435a columnar electrode
435b columnar electrode 435c columnar electrode
435d columnar electrode
438a, 438b, 438c electrode
439a, 439b, 439c, 439d, 439e wire
441a, 441b, 441c, 441d connection part
442a, 442b, 442c, 442d projection
444 oxide film
4100 sensor chip
4200 integrated circuit
4300 package
4302 space
4400 terminal
4402 lead
4402c end
4404 ground
4600 lid
491, 492 groove
501 sensor part
502a layer substrate
502b layer substrate
503 frame part
510 X-detection part
510a rectangular frame
511 movable electrode
512a, 512b beam
513a, 513b fixed electrode
514a, 514b via-electrode
520 Y-detection part
520a rectangular frame
521 movable electrode
522a, 522b beam
523a, 523b fixed electrode
530 Z-detection part
530a rectangular frame
531 movable electrode
532a, 532b, 532c, 532d beam
533a, 533b fixed electrode
533b1 rectangular region
533b2 projection
534a via-electrode
534b via-electrode
534c fixed electrode
5210 correction circuit
5100 sensor chip
5200 integrated circuit
5300 package
5400 terminal
5500 board
1000 sensor

The invention claimed is:

1. A connection assembly comprising:
 a sensor substrate;
 a layer substrate coupled to the sensor substrate so as to face an upper surface of the sensor substrate; and
 a wire connected between the sensor substrate and the layer substrate,
 wherein the sensor substrate includes:
  a first projection provided on the upper surface of the sensor substrate and extending in an extension direction along the upper surface of the sensor substrate; and
  a second projection provided on the upper surface of the sensor substrate and extending in the extension direction along the upper surface of the sensor substrate, and
 wherein the wire has:
  a first end sandwiched between the layer substrate and the first projection; and
  a second end sandwiched between the layer substrate and the second projection.

2. The connection assembly of claim 1,
 wherein the sensor substrate further includes:
  a third projection provided on the upper surface of the sensor substrate and extending in the extension direction; and
  a fourth projection provided on the upper surface of the sensor substrate and extending in the extension direction;
 wherein a length of the third projection in the extension direction is larger than a length of the first projection in the extension direction; and
 wherein a length of the fourth projection in the extension direction is larger than a length of the second projection in the extension direction.

3. The connection assembly of claim 2,
 wherein the sensor substrate further includes a columnar electrode; and
 wherein the first projection, the second projection, the third projection, and the fourth projection are disposed on an upper surface of the columnar electrode.

4. The connection assembly of claim 2, wherein the wire includes a portion including a first straight part and a second straight part extending from the first straight part, the first straight part extending from the first end to the second end, the second straight part extending perpendicularly from the first straight part between the first end and the second end viewing from above, the first straight part and the second straight part forming substantially a T-shape viewing from above.

5. The connection assembly of claim 1,
 wherein the sensor substrate further includes a connection part coupled to the layer substrate; and
 wherein the first projection and the second projection are disposed close to the connection part.

6. The connection assembly of claim 1,
 wherein the sensor substrate further includes a connection part coupled to the layer substrate; and
 wherein the connection part, the first projection, and the second projection are arranged on a straight line in parallel with the upper surface of the sensor substrate.

* * * * *